United States Patent
Kang et al.

(10) Patent No.: US 12,232,405 B2
(45) Date of Patent: Feb. 18, 2025

(54) DISPLAY DEVICE AND METHOD OF DETECTING DEFECT OF THE SAME

(71) Applicant: Samsung Display Co., Ltd., Yongin-Si (KR)

(72) Inventors: Bongil Kang, Namyangju-si (KR); Yujin Sin, Hwaseong-si (KR); Gayeon Yun, Seoul (KR)

(73) Assignee: Samsung Display Co., Ltd., Gyeonggi-Do (KR)

(*) Notice: Subject to any disclaimer, the term of this patent is extended or adjusted under 35 U.S.C. 154(b) by 497 days.

(21) Appl. No.: 17/547,186

(22) Filed: Dec. 9, 2021

(65) Prior Publication Data

US 2022/0336784 A1 Oct. 20, 2022

(30) Foreign Application Priority Data

Apr. 19, 2021 (KR) .................... 10-2021-0050427

(51) Int. Cl.
*H10K 71/00* (2023.01)
*H10K 59/131* (2023.01)
*H10K 59/40* (2023.01)
*H10K 71/70* (2023.01)

(52) U.S. Cl.
CPC ........... *H10K 71/00* (2023.02); *H10K 59/131* (2023.02); *H10K 59/40* (2023.02); *H10K 71/70* (2023.02); *H10K 71/861* (2023.02)

(58) Field of Classification Search
CPC ...... H10K 71/00; H10K 59/131; H10K 59/40; H10K 71/70; H10K 71/861; H10K 59/873; H10K 59/1275; H10K 59/129; H10K 59/88; H10K 77/111; G06F 1/1603; G06F 1/1652; G09G 3/006

See application file for complete search history.

(56) References Cited

U.S. PATENT DOCUMENTS

| | | |
|---|---|---|
| 8,031,275 B2 | 10/2011 | Lee |
| 10,607,323 B2 | 3/2020 | Han et al. |
| 11,029,788 B2 | 6/2021 | Park et al. |
| 11,035,908 B2 | 6/2021 | Lee et al. |
| 2019/0305234 A1* | 10/2019 | Jung ............. H10K 71/00 |

FOREIGN PATENT DOCUMENTS

| | | |
|---|---|---|
| KR | 10-1519844 B1 | 5/2015 |
| KR | 10-2017-0082394 A | 7/2017 |
| KR | 10-2019-0117026 A | 10/2019 |
| KR | 10-2020-0013194 A | 2/2020 |

* cited by examiner

*Primary Examiner* — Kyoung Lee
(74) *Attorney, Agent, or Firm* — Innovation Counsel LLP

(57) ABSTRACT

A display device includes a display module and a flexible circuit film connected to the display module. The display module includes a display panel and an input sensing layer. The flexible circuit film includes a base film, a ground line disposed on the base film, a plurality of connection lines disposed on the base film and electrically connected to at least one of the input sensing layer and the display panel, a conductive layer disposed on the connection lines and overlapping at least a portion of the connection lines, an insulating layer disposed on the conductive layer, and a cover tape disposed on the insulating layer and overlapping the ground line.

20 Claims, 15 Drawing Sheets

DISPLAY DEVICE AND METHOD OF DETECTING DEFECT OF THE SAME

CROSS-REFERENCE TO RELATED APPLICATION

This U.S. non-provisional patent application claims priority under 35 U.S.C. § 119 of Korean Patent Application No. 10-2021-0050427, filed on Apr. 19, 2021, the disclosure of which is hereby incorporated by reference in its entirety.

BACKGROUND

1. Field of Disclosure

The present disclosure relates to a display device and a method of detecting a defect of the same. More particularly, the present disclosure relates to a display device having improved sensing reliability and a method of detecting a defect of the display device.

2. Description of the Related Art

Multimedia electronic devices, such as televisions, mobile phones, tablet computers, navigation devices, and game devices, include a display device. The display device typically includes a display panel displaying images and a flexible circuit board connected to the display panel.

In addition, the electronic devices may include an input sensor that provides a touch-based input method allowing users to easily and intuitively input information or commands in addition to providing usual input methods using various input devices such as a button, a keyboard, a mouse, etc.

The flexible circuit board may include a variety of sensors and elements for the display panel and the input sensor.

SUMMARY

The present disclosure provides a display device having improved sensing reliability.

The present disclosure provides a method of detecting a defect of the display device and reducing a defective rate of manufacturing the display device.

According to an embodiment of the present inventive concept, a display device includes a display module including a display panel and an input sensing layer that is disposed on the display panel, and a flexible circuit film that is connected to the display module. The flexible circuit film includes a base film, a ground line disposed on the base film, a plurality of connection lines disposed on the base film and electrically connected to at least one of the input sensing layer and the display panel, a conductive layer disposed on the plurality of connection lines and overlapping at least a portion of the plurality of connection lines in a plan view, an insulating layer disposed on the conductive layer, and a cover tape disposed on the insulating layer and overlapping the ground line in the plan view.

The conductive layer may overlap at least a portion of the cover tape in the plan view.

The flexible circuit film may further include a sensor driving chip that is electrically connected to the input sensing layer and disposed on the base film.

The plurality of connection lines may include a plurality of sensor connection lines connecting the input sensing layer to the sensor driving chip, and the conductive layer may overlap at least a portion of the plurality of sensor connection lines in the plan view.

The input sensing layer may include a first sensing electrode, a second sensing electrode insulated from the first sensing electrode and forming a capacitance with the first sensing electrode, a first sensing line connected to the first sensing electrode, and a second sensing line connected to the second sensing electrode.

Each of the first sensing line and the second sensing line may be electrically connected to the plurality of sensor connection lines.

The conductive layer may include a first hole that exposes the ground line, and the insulating layer may include a second hole that exposes the ground line.

The cover tape may contact a portion of the ground line that is exposed through the first hole and the second hole.

The flexible circuit film may further include a panel driving chip that is electrically connected to the display panel and disposed on the base film.

The plurality of connection lines may include a plurality of driving lines connecting the display panel to the panel driving chip, and the conductive layer may overlap at least a portion of the plurality of driving lines in the plan view.

The insulating layer may include a hole that exposes the ground line, and the cover tape may contact a portion of the ground line that is exposed through the hole.

The display panel may include a light emitting element layer that includes a light emitting element and an encapsulation layer that covers the light emitting element layer.

The input sensing layer may be disposed directly on the encapsulation layer.

The flexible circuit film may further include at least one adhesive layer that is disposed between any two of the plurality of connection lines, the conductive layer, the insulating layer, and the cover tape that are adjacent to each other.

The cover tape may be a conductive tape.

According to an embodiment of the present inventive concept, a method includes preparing a display module of a display device that includes a display panel and an input sensing layer; preparing a flexible circuit film that is connected to the display module, the flexible circuit film including a base film, a ground line disposed on the base film, a plurality of connection lines disposed on the base film and electrically connected to at least one of the input sensing layer and the display panel, a conductive layer disposed on the plurality of connection lines and overlapping at least a portion of the plurality of connection lines in a plan view, an insulating layer disposed on the conductive layer, and a cover tape disposed on the insulating layer; inspecting a capacitance formed between the conductive layer and the cover tape; and detecting a defect of the display deice based on the capacitance.

An entire surface of the conductive layer may overlap the cover tape in the plan view.

The flexible circuit film further may include a sensor driving chip and a panel driving chip that are disposed on the base film, and the plurality of connection lines connect the sensor driving chip to the input sensing layer or connect the panel driving chip to the display panel.

A state of connection between the ground line and the cover tape may be determined as a normal state based on the capacitance lower than a threshold value, and the state of connection between the ground line and the cover tape may be determined as an abnormal state based on the capacitance equal to or greater than the threshold value.

The method further includes repairing the defect of the cover tape being separated from the ground line by reconnecting the cover tape to the ground line in response to the abnormal state.

According to the above, the display device that includes the conductive layer disposed in the flexible circuit film can detect separation of the cover tape from the ground line.

According to the above, inspection of a defect that may be caused by the cover tape being separated from the ground line may reduce a defective rate of manufacturing the display device.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1:
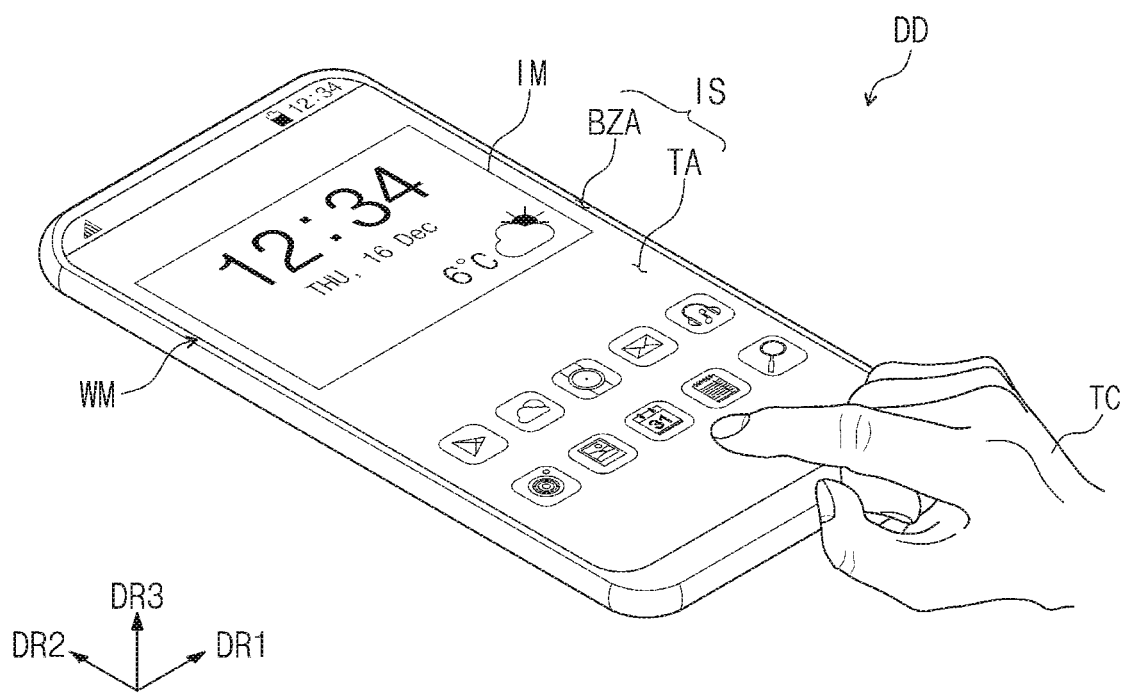
FIG. 1 is an assembled perspective view showing a display device according to an embodiment of the present disclosure.

In the present disclosure, it will be understood that when an element or layer is referred to as being "on," "connected to," or "coupled to" another element or layer, it can be directly on, connected, or coupled to the other element or layer or one or more intervening elements or layers may be present therebetween.

Like numerals refer to like elements throughout the present disclosure. In the drawings, the thickness, ratio, and dimension of components may be exaggerated for effective description of the technical aspect of the present disclosure.

As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure. As used herein, the singular forms, "a," "an," and "the" are intended to include the plural forms as well, unless the context clearly indicates otherwise.

Spatially relative terms, such as "beneath," "below," "lower," "above," "upper," and the like, may be used herein for ease of description to describe one element or feature's relationship to another element(s) or feature(s) as illustrated in the figures.

It will be further understood that the terms "includes" and/or "including," when used in the present disclosure, specify the presence of stated features, integers, steps, operations, elements, and/or components, but do not preclude the presence or addition of one or more other features, integers, steps, operations, elements, components, and/or groups thereof.

Unless otherwise defined, terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present disclosure will be explained in detail with reference to the accompanying drawings.

FIG. 1 is an assembled perspective view showing a display device DD according to an embodiment of the present disclosure.

Referring to FIG. 1, the display device DD may have a rectangular shape defined by short sides substantially parallel to a first direction DR1 and long sides substantially parallel to a second direction DR2 that crosses the first direction DR1. However, the shape of the display device DD should not be limited to the rectangular shape, and the display device DD may have various shapes without deviating from the scope of the present disclosure.

FIG. 1 shows a smartphone as a representative example of the display device DD, however, the display device DD should not be limited to the smartphone. The display device DD may be applied to various types of display devices, for example, a large-sized display device such as a television set or a monitor, and a small-sized display device and/or medium-sized display device such as a tablet computer, a car navigation device, or a game device.

As shown in FIG. 1, the display device DD may include a window WM. The window WM may include a display surface IS that is substantially parallel to a first direction DR1 and a second direction DR2. The display device DD may display an image IM through the display surface IS toward a third direction DR3. The display surface IS may correspond to a front (or upper) surface of the display device DD.

In the present embodiment, front (or upper) and rear (or lower) surfaces of each member of the display device DD may be defined with respect to the third direction DR3. The front and rear surfaces may be opposite to each other in the third direction DR3, and a normal line direction of each of the front and rear surfaces may be substantially parallel to the third direction DR3.

A separation distance in the third direction DR3 between the front surface and the rear surface may correspond to a thickness of the display device DD in the third direction DR3. Meanwhile, directions indicated by the first, second, and third directions DR1, DR2, and DR3 are relative to each other, and thus, the directions indicated by the first, second, and third directions DR1, DR2, and DR3 may be changed to other directions without deviating from the scope of the present disclosure.

The display surface IS of the window WM may be divided into a plurality of areas. For example, the display surface IS of the window WM may be divided into a transmission area TA and a bezel area BZA.

The transmission area TA may correspond to an area through which the image IM is displayed, and a user may view the image IM through the transmission area TA. In the present embodiment, the transmission area TA may have a quadrangular shape with rounded corners, however, this is merely one example. The transmission area TA may have a variety of shapes and should not be particularly limited.

The bezel area BZA may be disposed adjacent to the transmission area TA, and the image IM may not be displayed through the bezel area BZA. According to an embodiment, the bezel area BZA may have a predetermined color. The bezel area BZA may surround the transmission area TA. In this case, the transmission area TA may have a shape defined by the bezel area BZA, or vice versa, however, this is merely one example. According to an embodiment, the bezel area BZA may be disposed adjacent to only one side of the transmission area TA or may be omitted.

The display device DD may sense a user input TC applied thereto from the outside. The user input TC may include various forms of inputs provided from the outside of the display device DD, such as an input by a part of the user's body, light, heat, or pressure. In the present embodiment, the user input TC is shown as the user's hand that touches the front surface of the display device DD. However, this is merely one example, and the user input TC may be provided in various ways without deviating from the scope of the present disclosure. For example, the display device DD may sense the user input TC applied to a side surface or a rear surface of the display device DD according to a structure of the display device DD, and the user input TC should not be particularly limited to these examples.

The display device DD may display the image IM through the display surface IS and may substantially simultaneously sense the user input TC. In the present embodiment, an area in which the user input TC is sensed includes the transmission area TA through which the image IM is displayed, however, this is merely one example. According to an embodiment, the area in which the user input TC is sensed may include the bezel area BZA or may correspond to an entire area of the display surface IS.

Figure 2A:
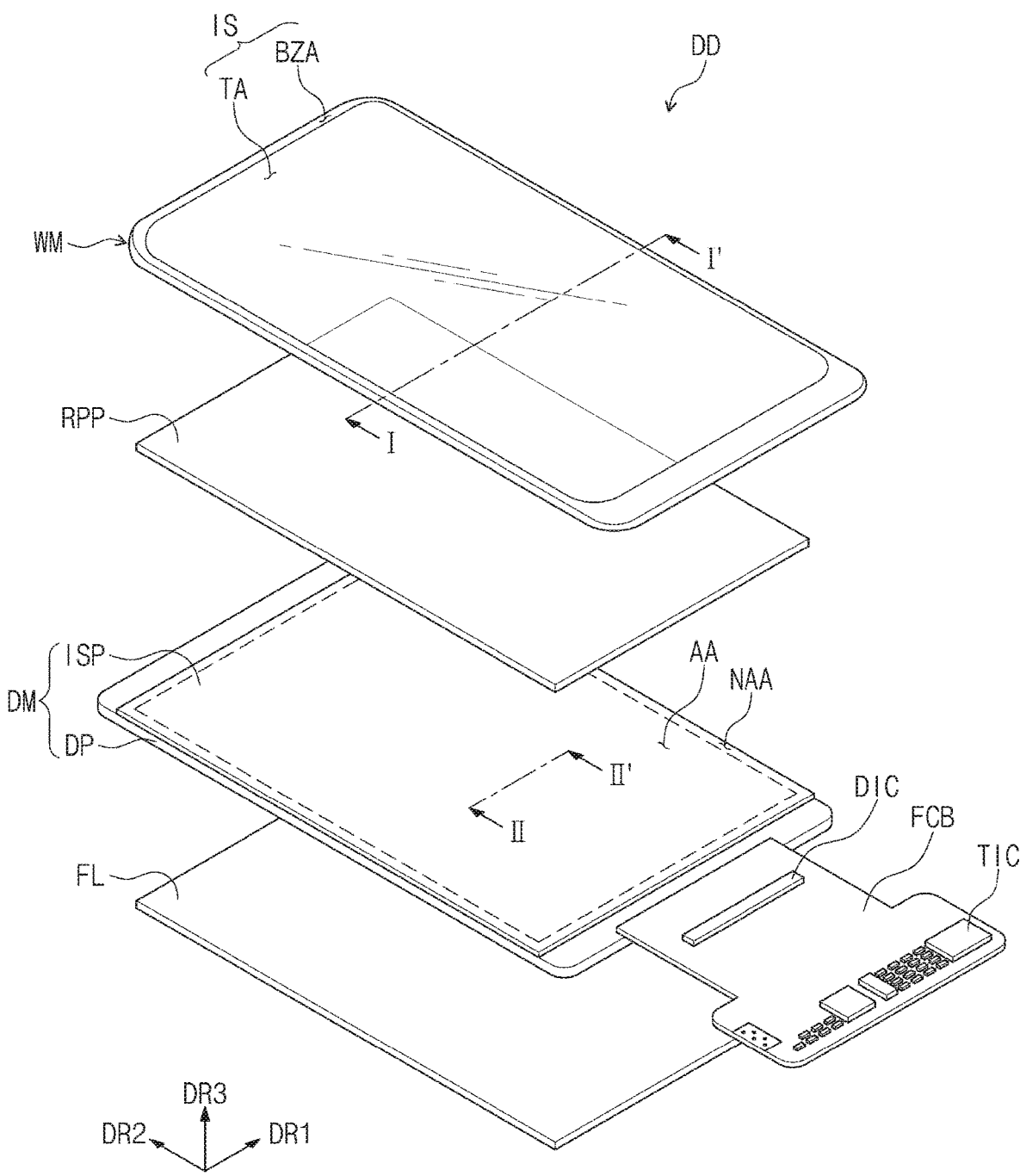
FIG. 2A is an exploded perspective view showing a display device according to an embodiment of the present disclosure.
Figure 2B:
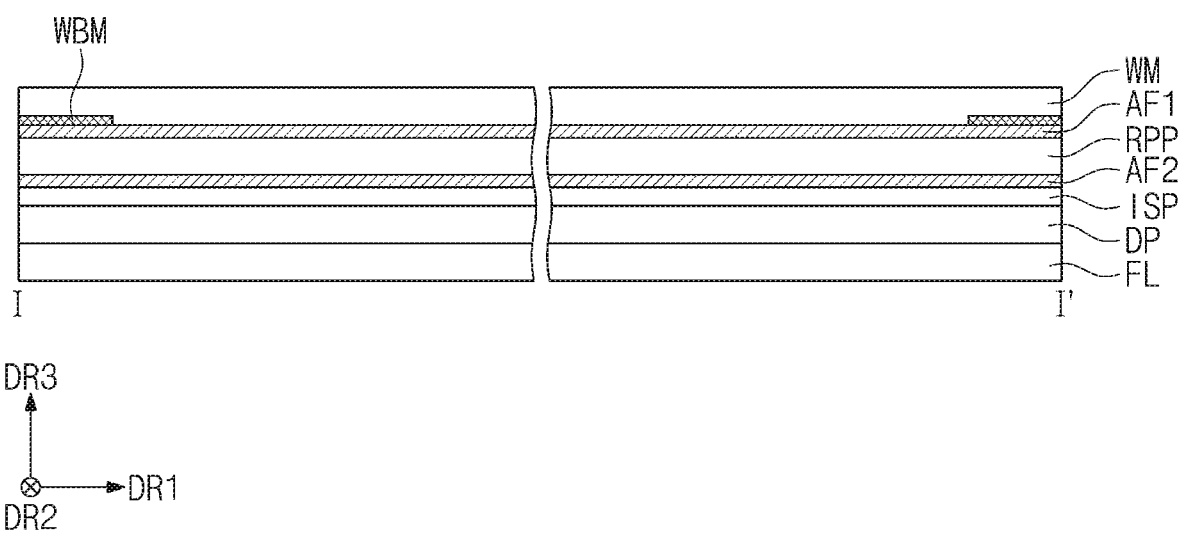
FIG. 2B is a cross-sectional view taken along a line I-I' shown in FIG. 2A.
Figure 2C:
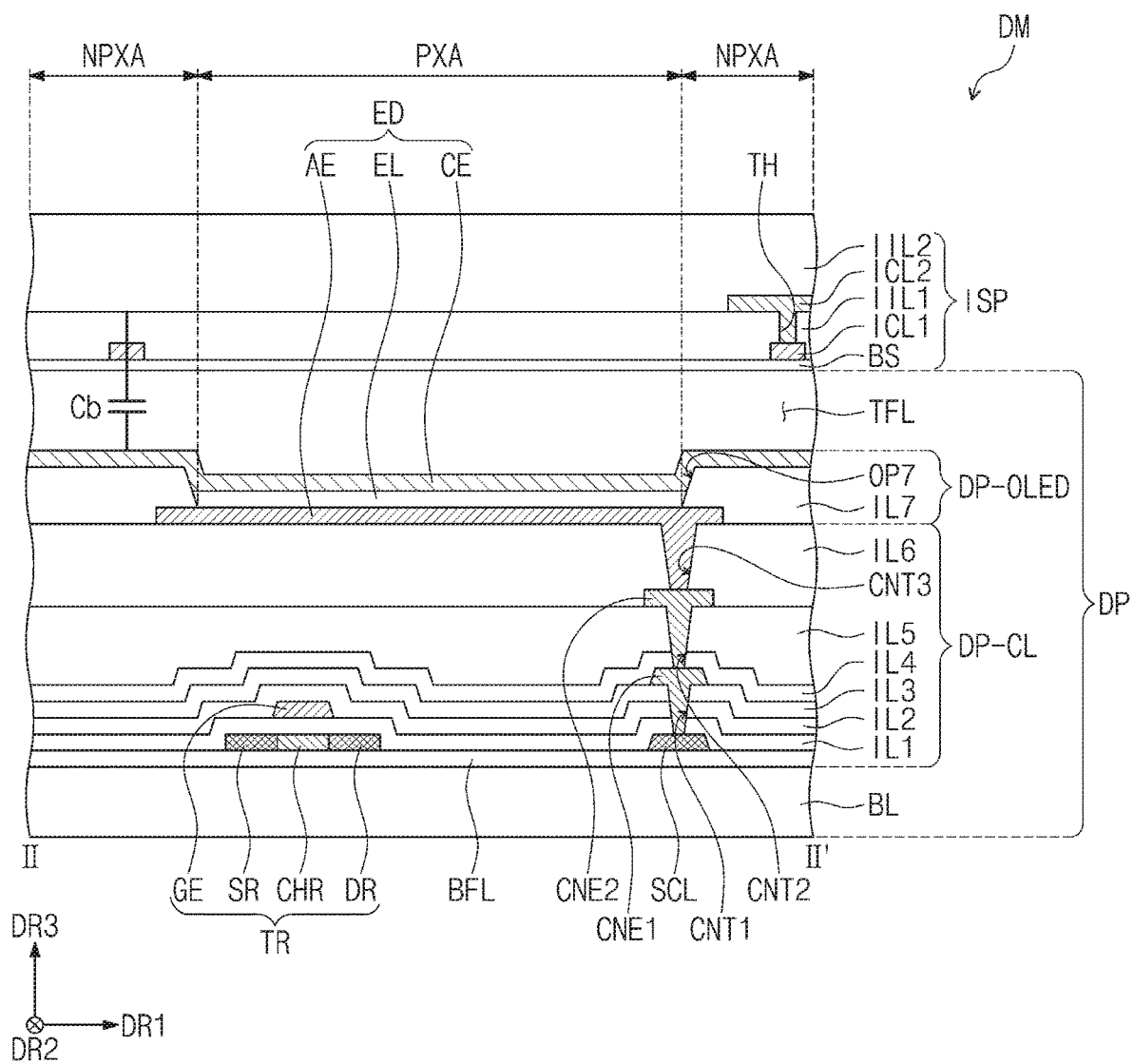
FIG. 2C is a cross-sectional view taken along a line II-II' shown in FIG. 2A.

FIG. 2A is an exploded perspective view showing the display device DD according to an embodiment of the present disclosure. FIG. 2B is a cross-sectional view taken along a line I-I' shown in FIG. 2A. FIG. 2C is a cross-sectional view taken along a line II-II' shown in FIG. 2A.

Referring to FIGS. 2A and 2B, the display device DD may include the window WM, an anti-reflective film RPP, a display module DM, a flexible circuit film FCB, and a functional layer FL.

The window WM may be disposed on the display module DM. The window WM may protect the display module DM from external impacts and/or influences. The window WM may include an optically transparent insulating material, and the user may easily view the image generated by the display module DM through the window WM. The window WM may transmit the image IM provided by the display module DM and may buffer external impacts to prevent the display module DM from being damaged or malfunctioning due to the external impacts. The external impacts may refer to external forces represented by excessive pressure or stress that may cause a defect in the display module DM.

According to an embodiment, the window WM may include at least one of a glass and a synthetic resin. As an example, the window WM may include at least one of glass, polyimide (PI), and polyethylene terephthalate (PET). In another example, the window WM may be a thin film glass or a synthetic resin film.

The window WM may have a single-layer or multi-layer structure. For example, the window WM may include a plurality of synthetic resin films coupled to each other by an adhesive, or a glass substrate and a synthetic resin film that are coupled by an adhesive. The window WM may include a flexible material.

The window WM may include a light blocking pattern WBM to define the bezel area BZA. The light blocking pattern WBM may be a colored organic layer and may be formed by a coating method.

One or more functional layers may be disposed between the display module DM and the window WM. As an example of a functional layer FL, the anti-reflective film RPP that blocks reflection of the external light is shown in FIGS. 2A and 2B.

A first adhesive film AF1 may be disposed between the window WM and the anti-reflective film RPP. The first adhesive film AF1 may include an optically clear adhesive film (OCA), an optically clear resin (OCR), and/or a pressure sensitive adhesive film (PSA), however, the present disclosure should not be limited thereto or thereby.

The anti-reflective film RPP may block reflection of the external light incident thereto through the window WM of the display device DD and prevent elements of the display module DM from being viewed from the outside. The anti-reflective film RPP may include a retarder and a polarizer. The retarder may be a film-type or liquid crystal coating-type and may include a $\lambda/2$ retarder and/or a $\lambda/4$ retarder. The polarizer may be a film-type or liquid crystal coating-type. The film-type polarizer and the film-type retarder may include a stretching-type synthetic resin film, and the liquid crystal coating-type polarizer and the film-type retarder may include liquid crystal molecules aligned in a predetermined alignment. The retarder and the polarizer may be implemented as a single polarizing film. The functional layer FL may further include a protective film disposed above and/or under the polarizing film.

The anti-reflective film RPP may be disposed on the display module DM. A second adhesive film AF2 may be disposed between the display module DM and the anti-reflective film RPP. The second adhesive film AF2 may include an optically clear adhesive film (OCA), an optically clear adhesive resin (OCR), or a pressure sensitive adhesive film (PSA), however, the present disclosure should not be limited thereto or thereby.

The display module DM may include a display panel DP and an input sensing layer ISP. The display panel DP may generate the image IM, and the input sensing layer ISP may sense an external input applied thereto. An example of the external input is the user input TC, and the external input may include various forms of inputs such as an input by or from a portion of a user's body, light, heat, a stylus, a pen, or pressure.

The display panel DP according to an embodiment of the present disclosure may be a light-emitting display panel, however, it should not be particularly limited. For instance, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot and/or a quantum rod. Hereinafter, the organic light emitting display panel will be described as a representative example of the display panel DP.

The input sensing layer ISP may be disposed on the display panel DP. According to an embodiment, the input sensing layer ISP may be disposed directly on the display panel DP. As an example, the input sensing layer ISP may be formed on the display panel DP through successive processes. In the present disclosure, the expression that "the input sensing layer ISP is disposed directly on the display panel DP" means that no intervening elements are present between the input sensing layer ISP and the display panel DP.

However, the present disclosure should not be limited thereto or thereby. For example, an adhesive film may be disposed between the input sensing layer ISP and the display panel DP. In this case, the input sensing layer ISP may not be formed through the successive processes with the display panel DP, and the input sensing layer ISP may be disposed on an upper surface of the display panel DP by the adhesive film after being manufactured through a separate process.

FIG. 2C is a cross-sectional view showing the display module DM according to an embodiment. In the present example, the display module DM includes the display panel DP and the input sensing layer ISP that is disposed directly on the display panel DP; however, it should not be limited thereto or thereby.

Referring to FIG. 2C, the display panel DP may include a base layer BL, a circuit layer DP-CL, a light emitting element layer DP-OLED, and an encapsulation layer TFL.

The base layer BL may provide a base surface on which the circuit layer DP-CL is disposed. The base layer BL may include a synthetic resin layer. According to an embodiment, the base layer BL may have a multi-layer structure. For instance, the base layer BL may have a three-layer structure of a synthetic resin layer, an adhesive layer, and another synthetic resin layer. The synthetic resin layer may be a polyimide-based resin layer, however, a material for the synthetic resin layer should not be particularly limited thereto. The synthetic resin layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin. Further, the base layer BL may include a glass substrate or an organic/inorganic composite substrate.

The circuit layer DP-CL may be disposed on the base layer BL. The circuit layer DP-CL may include an insulating layer, a semiconductor layer including a semiconductor pattern, a conductive layer including a conductive pattern, and a signal line. The insulating layer, the semiconductor layer, and the conductive layer may be formed on the base layer BL by a coating process or a depositing process, and then may be selectively patterned through photolithography processes to form the semiconductor pattern, the conductive pattern, and the signal line of the circuit layer DP-CL.

At least one inorganic layer may be formed on an upper surface of the base layer BL. The inorganic layer may include at least one of aluminum oxide, titanium oxide, silicon oxide, silicon oxynitride, zirconium oxide, and hafnium oxide. The inorganic layer may be formed in multiple layers. The inorganic layers may form a barrier layer and/or a buffer layer BFL. The buffer layer BFL may increase a coupling force between the base layer BL and the semiconductor pattern of the semiconductor layer. The buffer layer BFL may include a silicon oxide layer and a silicon nitride layer that are alternately stacked with each other. In the present embodiment, the circuit layer DP-CL is shown as including the buffer layer BFL, however, the buffer layer BFL may be omitted according to some embodiments.

The semiconductor pattern may be disposed on the buffer layer BFL. The semiconductor pattern may include poly silicon, however, it should not be limited thereto or thereby. According to an embodiment, the semiconductor pattern may include amorphous silicon and/or metal oxide.

FIG. 2C shows only a portion of the semiconductor pattern, and it is understood that the semiconductor pattern may be further disposed in other areas of the display module DM. The semiconductor pattern may be arranged with a specific pattern and/or configuration over pixels of the display module DM. The semiconductor pattern may have different electrical properties depending on whether it is doped or not or whether it is doped with an N-type dopant or a P-type dopant. The semiconductor pattern may include a first region having a relatively high electrical conductivity and a second region having a relatively low electrical conductivity. The first region may be doped with the N-type dopant or the P-type dopant. An N-type transistor may include a doped region that is doped with the N-type dopant. A P-type transistor may include a doped region that is doped with the P-type dopant. The second region may correspond to a non-doped region or may be doped at a concentration lower than that of the first region.

The first region may have an electrical conductivity greater than that of the second region and may substantially serve as an electrode or a signal line. The second region may substantially correspond to an active area (or a channel area) of a transistor. In other words, a portion of the semiconductor pattern may correspond to the active area of the transistor, and another portion of the semiconductor pattern may correspond to a source area or a drain area of the transistor.

According to an embodiment, each of the pixels may have a pixel circuit including seven transistors, one capacitor, and one light emitting element, and the pixel circuit of the transistor may be varied without deviating from the scope of the present disclosure. For convenience of illustration, FIG. 2C shows that the pixel includes one transistor TR and a light emitting element ED.

The semiconductor pattern may include a source area SR, a channel area CHR, and a drain area DR of the transistor TR. The source area SR and the drain area DR may be disposed in opposite sides of the channel area CHR in the cross-sectional view. FIG. 2C shows a portion of a circuit line SCL that may be disposed in the same layer as the semiconductor pattern. Although not shown in figures, the circuit line SCL may be electrically connected to the transistor TR.

A first insulating layer IL1 may be disposed on the buffer layer BFL. The first insulating layer IL1 may commonly overlap the pixels and may cover the semiconductor pattern. The first insulating layer IL1 may include an inorganic layer and/or an organic layer and may have a single-layer or multi-layer structure. The first insulating layer IL1 may include at least one of aluminum oxide, titanium oxide, silicon oxide, silicon nitride, silicon oxynitride, zirconium oxide, and hafnium oxide. In the present embodiment, the first insulating layer IL1 may have a single-layer structure of a silicon oxide layer. An insulating layer of the circuit layer DP-CL to be described later may also include an inorganic layer and/or an organic layer and may have a single-layer or multi-layer structure. The inorganic layer may include at least one of the above-mentioned materials, however, it should not be limited thereto.

A gate GE of the transistor TR may be disposed on the first insulating layer IL1. The gate GE may correspond to a portion of a metal pattern. The gate GE may overlap the channel area CHR. The gate GE may be used as a mask in a doping process of the semiconductor pattern.

A second insulating layer IL2 may be disposed on the first insulating layer IL1 and may cover the gate GE. The second insulating layer IL2 may commonly overlap the pixels. The second insulating layer IL2 may include an inorganic layer and/or an organic layer and may have a single-layer or multi-layer structure. In the present embodiment, the second insulating layer IL2 may have a single-layer structure of a silicon oxide layer.

A third insulating layer IL3 may be disposed on the second insulating layer IL2. In the present embodiment, the third insulating layer IL3 may have a single-layer structure of a silicon oxide layer. A first connection electrode CNE1 may be disposed on the third insulating layer IL3. The first connection electrode CNE1 may be connected to the circuit line SCL through a contact hole CNT1 that is defined through the first, second, and third insulating layers IL1, IL2, and IL3.

A fourth insulating layer IL4 may be disposed on the third insulating layer IL3. The fourth insulating layer IL4 may have a single-layer structure of a silicon oxide layer.

A fifth insulating layer IL5 may be disposed on the fourth insulating layer IL4. The fifth insulating layer IL5 may include an organic layer.

A second connection electrode CNE2 may be disposed on the fifth insulating layer IL5. The second connection electrode CNE2 may be connected to the first connection electrode CNE1 via a contact hole CNT2 that is defined through the fourth insulating layer IL4 and the fifth insulating layer IL5.

A sixth insulating layer IL6 may be disposed on the fifth insulating layer IL5 and may cover the second connection electrode CNE2. The sixth insulating layer IL6 may include an organic layer.

The light emitting element layer DP-OLED may be disposed on the circuit layer DP-CL. The light emitting element layer DP-OLED may include the light emitting element ED. For example, the light emitting element layer DP-OLED may include an organic light emitting material, a quantum dot, a quantum rod, or a micro-LED. The light emitting element ED may include a first electrode AE, a light emitting layer EL, and a second electrode CE.

The first electrode AE may be disposed on the sixth insulating layer IL6. The first electrode AE may be connected to the second connection electrode CNE2 via a contact hole CNT3 that is defined through the sixth insulating layer IL6.

A pixel definition layer IL7 may be disposed on the sixth insulating layer IL6 and may cover at least a portion of the first electrode AE. An opening OP7 may be defined through the pixel definition layer IL7. At least a portion of the first electrode AE may be exposed through the opening OP7 of the pixel definition layer IL7. In the present embodiment, a light emitting area PXA may correspond to the portion of the first electrode AE that is exposed through the opening OP7. A non-light-emitting area NPXA may surround the light emitting area PXA.

The light emitting layer EL may be disposed on the first electrode AE. The light emitting layer EL may be disposed in the opening OP7. In one embodiment, each of the pixels after being divided into plural portions, and the light emitting layer EL may be formed in each of the pixels. In this case, each of the light emitting layers EL may emit a light having at least one of blue, red, and green colors, however, it should not be limited thereto or thereby. In another embodiment, the light emitting layer EL may be commonly provided to the pixels. In this case, the light emitting layer EL may provide a blue light or a white light.

The second electrode CE may be disposed on the light emitting layer EL. The second electrode CE may have an integral shape and may be commonly disposed over the pixels. A common voltage may be applied to the second electrode CE, and the second electrode CE may be referred to as a common electrode.

Although not shown in figures, a hole control layer may be disposed between the first electrode AE and the light emitting layer EL. The hole control layer may be commonly disposed in the light emitting area PXA and the non-light-emitting area NPXA. The hole control layer may include a hole transport layer and a hole injection layer. An electron control layer may be disposed between the light emitting layer EL and the second electrode CE. The electron control layer may include an electron transport layer and an electron injection layer. The hole control layer and the electron control layer may be commonly formed in the plural pixels using an open mask.

The encapsulation layer TFL may be disposed on the light emitting element layer DP-OLED. The encapsulation layer TFL may include one inorganic layer, an organic layer, and another inorganic layer that are sequentially stacked, however, the layers of the encapsulation layer TFL should not be limited thereto or thereby.

The inorganic layers of the encapsulation layer TFL may protect the light emitting element layer DP-OLED from moisture and oxygen, and the organic layer of the encapsulation layer TFL may protect the light emitting element layer DP-OLED from a foreign substance such as dust particles. Examples of the inorganic layers may include a silicon nitride layer, a silicon oxynitride layer, a silicon oxide layer, a titanium oxide layer, and an aluminum oxide layer. The organic layer may include an acrylic-based organic layer, however, it should not be limited thereto or thereby.

According to an embodiment, the input sensing layer ISP may be disposed directly on the display panel DP. The input sensing layer ISP may include a base layer BS, a first conductive layer ICL1, a first sensor insulating layer IIL1, a second conductive layer ICL2, and a second sensor insulating layer IIL2.

The base layer BS may be an inorganic layer including at least one of silicon nitride, silicon oxynitride, and silicon oxide. According to an embodiment, the base layer BS may include an organic layer that includes an epoxy-based resin, an acrylic-based resin, or an imide-based resin. The base layer BS may have a single-layer structure or a multi-layer structure including multiple layers stacked in the third direction DR3.

Each of the first conductive layer ICL1 and the second conductive layer ICL2 may have a single-layer structure or a multi-layer structure including multiple layers stacked in the third direction DR3.

The single-layer structure may include a metal layer or a transparent conductive layer. The metal layer may include molybdenum, silver, titanium, copper, aluminum, or alloys thereof. The transparent conductive layer may include a transparent conductive oxide such as indium tin oxide (ITO), indium zinc oxide (IZO), zinc oxide (ZnO), indium zinc tin oxide (ITZO), or the like. In addition, the transparent conductive layer may include a conductive polymer such as poly(3,4-ethylenedioxythiophene) (PEDOT), a metal nanowire, a graphene, or the like.

The conductive layer having a multi-layer structure may include one or more metal layers. As an example, the metal layers may have a three-layer structure of titanium/aluminum/titanium. In another example, the conductive layer having a multi-layer structure may include at least one metal layer and at least one transparent conductive layer. The first sensor insulating layer IIL1 may cover the first conductive layer ICL1, and the second sensor insulating layer IIL2 may cover the second conductive layer ICL2. The second conductive layer ICL2 may contact the first conductive layer ICL1 through an opening TH that penetrates through the first sensor insulating layer IIL1. In the present embodiment, each of the first sensor insulating layer IIL1 and the second sensor insulating layer IIL2 is shown to have a single-layer structure, however, it should not be limited thereto or thereby.

At least one of the first sensor insulating layer IIL1 and the second sensor insulating layer IIL2 may include an inorganic layer. The inorganic layer may include at least one of aluminum oxide, titanium oxide, silicon oxide, silicon nitride, silicon oxynitride, zirconium oxide, and hafnium oxide.

At least one of the first sensor insulating layer IIL1 and the second sensor insulating layer IIL2 may include an organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

Referring back to FIG. 2A, the display module DM may display the image IM in response to electrical signals and may transmit/receive information in response to the external input. The display module DM may include an active area AA and a peripheral area NAA. The active area AA may correspond to an area that emits the image IM provided by the display module DM.

The peripheral area NAA may be adjacent to the active area AA. For example, the peripheral area NAA may surround the active area AA. However, this is merely one example, and the peripheral area NAA may have various shapes and should not be particularly limited. According to an embodiment, the active area AA of the display module DM may correspond to at least a portion of the transmission area TA of the display surface IS.

The functional layer FL may be disposed on a rear surface of the display module DM. The functional layer FL may include at least one layer. As an example, the functional layer FL may be a metal layer and/or a cushion layer. The metal layer may support the display module DM. The cushion layer may include a polymer material and may absorb external impacts applied thereto from the outside. In addition, the functional layer FL may further include an adhesive layer.

The flexible circuit film FCB may be electrically connected to the display module DM. The flexible circuit film FCB may be coupled with the peripheral area NAA of the display module DM by a bonding process.

The flexible circuit film FCB may further include a panel driving chip DIC and a sensor driving chip TIC. The panel driving chip DIC may be mounted on the flexible circuit film FCB and electrically connected to the display panel DP. The panel driving chip DIC may include a plurality of driving elements. For example, the panel driving chip DIC may include a data driving circuit that drives the pixels of the display panel DP. FIG. 2A shows that the panel driving chip DIC is mounted on the flexible circuit film FCB, however, it should not be limited thereto or thereby.

The sensor driving chip TIC may be mounted on the flexible circuit film FCB and electrically connected to the input sensing layer ISP.

The flexible circuit film FCB may further include a plurality of driving elements mounted on the flexible circuit film FCB. The driving elements may include a circuit that converts signals input thereto from the outside to signals suitable for the panel driving chip DIC and the sensor driving chip TIC or to signals suitable to drive the display panel DP. The flexible circuit film FCB may be bent and disposed on the rear surface of the display module DM.

Figure 3:
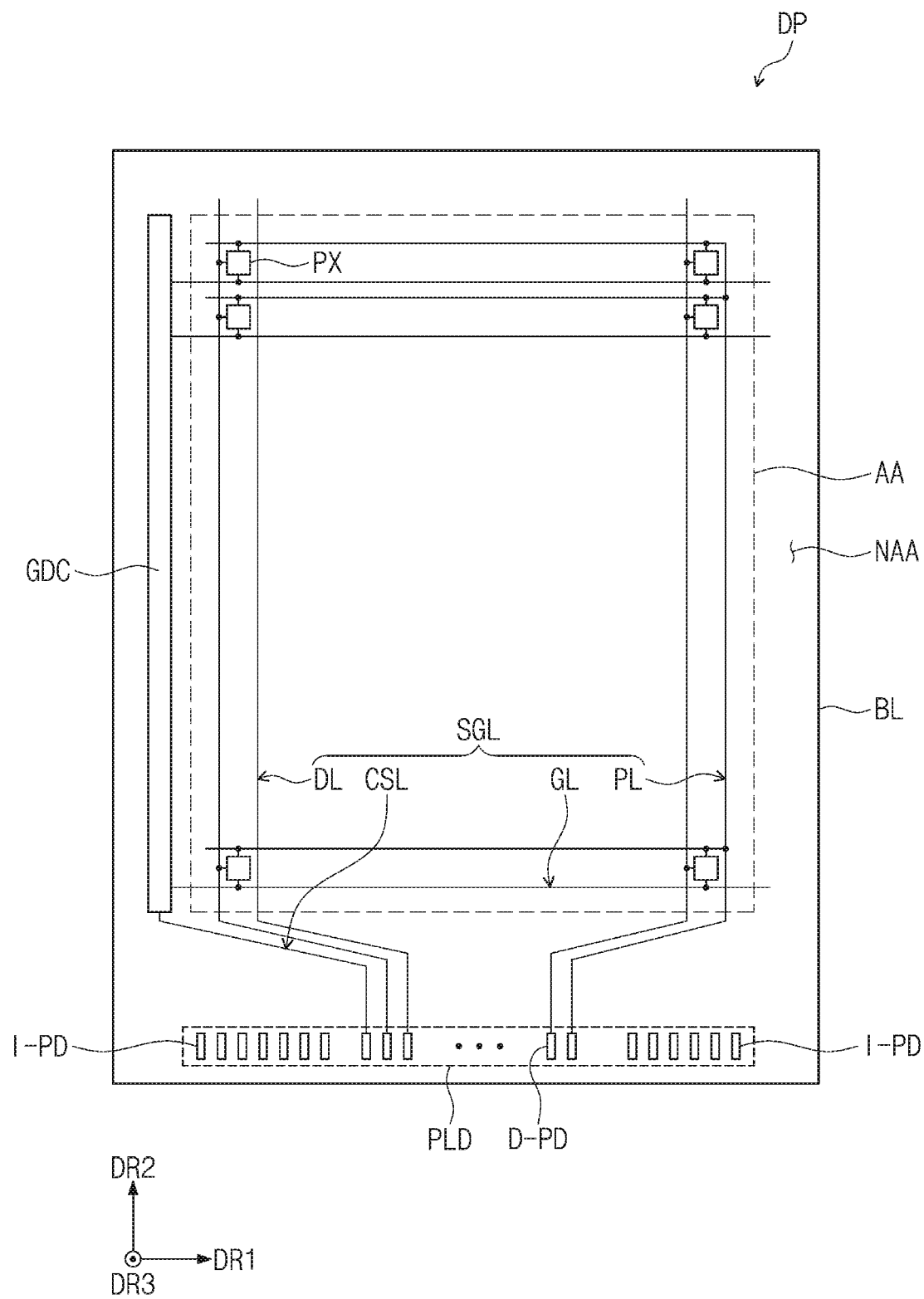
FIG. 3 is a plan view showing a display panel according to an embodiment of the present disclosure.
Figure 4:
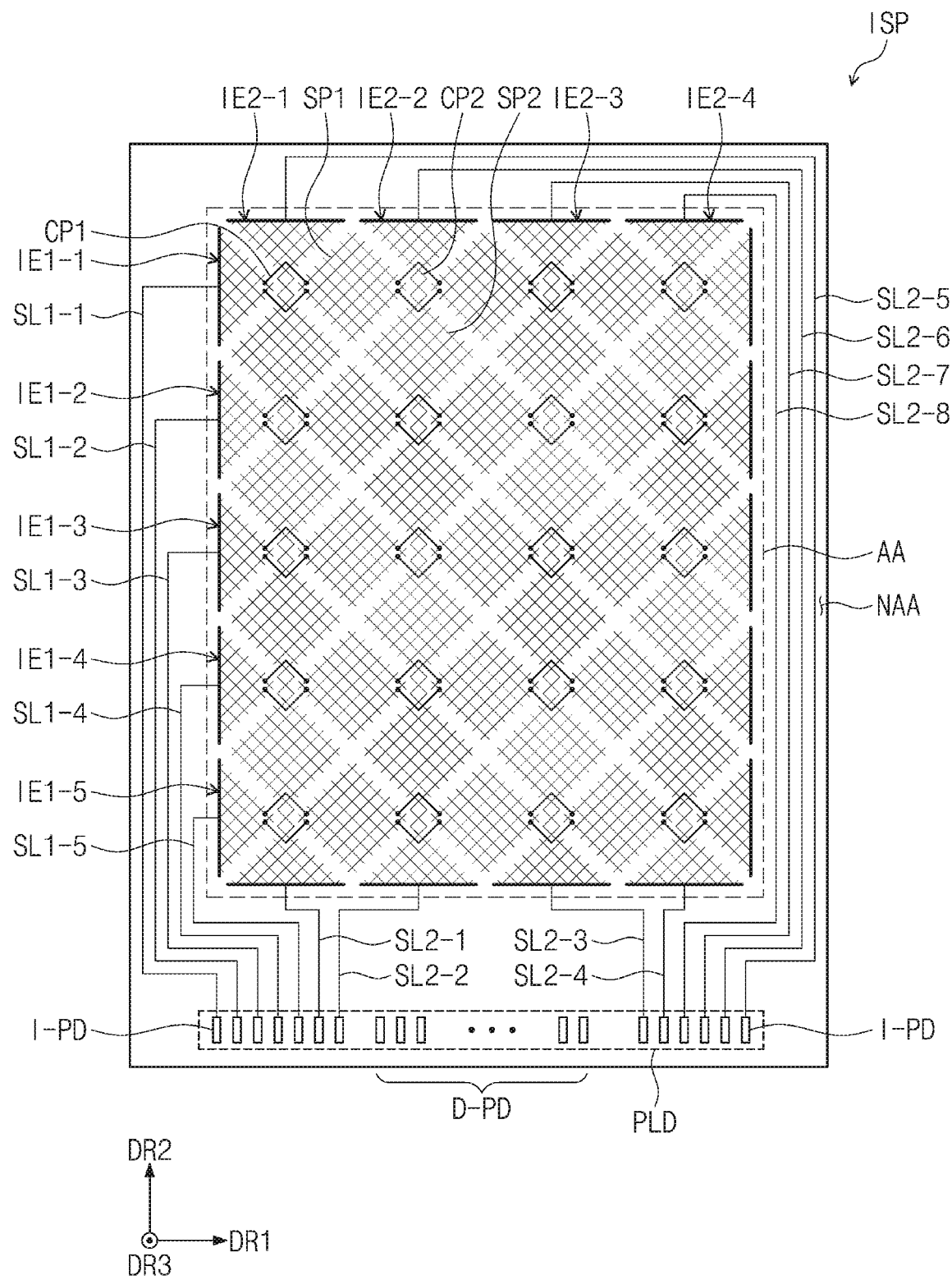
FIG. 4 is a plan view showing an input sensing layer according to an embodiment of the present disclosure.

FIG. 3 is a plan view showing the display panel DP according to an embodiment of the present disclosure. FIG. 4 is a plan view showing the input sensing layer ISP according to an embodiment of the present disclosure.

Referring to FIGS. 3 and 4, the display panel DP may include a driving circuit GDC, a plurality of signal lines SGL, a plurality of pixels PX, and a pad part PLD. The pad part PLD may include input pads I-PD and pixel pads D-PD that are disposed in the peripheral area NAA, and each of the pixel pads D-PD is connected to a corresponding signal line among the signal lines SGL.

The pixels PX may be arranged in the active area AA of the display panel DP. Each of the pixels PX may include the light emitting element ED of the light emitting element layer DP-OLED and a pixel driving circuit that is connected to the light emitting element ED as shown in FIG. 2C. The pixel driving circuit may include the transistor TR shown in FIG. 2C. The driving circuit GDC, the signal lines SGL, the pad part PLD, and the pixel driving circuit may be included in the circuit layer DP-CL shown in FIG. 2C.

The driving circuit GDC may include a gate driving circuit. The gate driving circuit may generate a plurality of gate signals and sequentially output the gate signals to a plurality of gate lines. The gate driving circuit may further output other control signals to the pixel driving circuit.

The signal lines SGL may include a plurality of gate lines GL, a plurality of data lines DL, a power line PL, and a control signal line CSL. Each of the gate lines GL and each of the data lines DL may be connected to a corresponding pixel among the pixels PX. The power line PL may be connected to the pixels PX. The control signal line CSL may provide control signals to the gate driving circuit. The signal lines SGL may overlap the active area AA and the peripheral area NAA.

The pad part PLD may be connected to the flexible circuit film FCB (refer to FIG. 2A). The pixel pads D-PD of the pad part PLD may electrically connect the flexible circuit film FCB to the display panel DP and the input pads I-PD of the pad part PLD may electrically connect the flexible circuit film FCB to the input sensing layer ISP.

The pixel pads D-PD may be connected to the corresponding pixels PX via the signal lines SGL. In an embodiment, the driving circuit GDC may be connected to one pixel pad among the pixel pads D-PD.

Referring to FIG. 4, the input sensing layer ISP may include first sensing electrodes IE1-1 to IE1-5, first sensing lines SL1-1 to SL1-5 respectively connected to the first sensing electrodes IE1-1 to IE1-5, second sensing electrodes IE2-1 to IE2-4, and second sensing lines SL2-1 to SL2-4 respectively connected to the second sensing electrodes IE2-1 to IE2-4. In an embodiment, the input sensing layer ISP may further include third sensing lines SL2-5 to SL2-8 respectively connected to the second sensing electrodes IE2-1 to IE2-4. In this case, the second sensing lines SL2-1 to SL2-4 may be connected to one ends of the second sensing electrodes IE2-1 to IE2-4, and the third sensing lines SL2-5 to SL2-8 may be connected to the other ends of the second sensing electrodes IE2-1 to IE2-4.

The first sensing electrodes IE1-1 to IE1-5 may cross the second sensing electrodes IE2-1 to IE2-4. The first sensing electrodes IE1-1 to IE1-5 may be arranged in the second direction DR2 and may extend in the first direction DR1. The second sensing electrodes IE2-1 to IE2-4 may be arranged in the first direction DR1 and may be arranged in the second direction DR2. The first sensing electrodes IE1-1 to IE1-5 may be insulated from the second sensing electrodes IE2-1 to IE2-4 and may form a capacitance with the second sensing electrodes IE2-1 to IE2-4.

Each of the first sensing electrodes IE1-1 to IE1-5 may include first sensing portions SP1 and first connection portions CP1 that are disposed in the active area AA. Each of the second sensing electrodes IE2-1 to IE2-4 may include second sensing portions SP2 and second connection portions CP2 that are disposed in the active area AA. Among the first sensing portions SP1, two first sensing portions disposed at opposite ends of the corresponding first sensing electrode IE1 may have a smaller size (e.g., ½) than a size of other first sensing portion disposed away from the ends. Similarly, among the second sensing portions SP2, two second sensing portions disposed at opposite ends of the corresponding second sensing electrode IE2 may have a smaller size (e.g., ½) than a size of other second sensing portion disposed away from the ends.

FIG. 4 shows the first sensing electrodes IE1-1 to IE1-5 and the second sensing electrodes IE2-1 to IE2-4 according to an embodiment, however, shapes of the sensing electrodes should not be limited thereto or thereby. According to an embodiment, each of the first sensing electrodes IE1-1 to IE1-5 and the second sensing electrodes IE2-1 to IE2-4 may have a shape in which the sensing portion and the connection portion are not distinguished from each other, for example, a bar shape. In another embodiment, each of the first sensing portions SP1 and the second sensing portions SP2 may have a lozenge shape, however, they should not be limited thereto or thereby. The first sensing portions SP1 and the second sensing portions SP2 may have other polygonal shapes.

In each of the first sensing electrodes IE1-1 to IE1-5, the first sensing portions SP1 may be arranged in the first direction DR1, and in each of the second sensing electrodes IE2-1 to IE2-4, the second sensing portions SP2 may be arranged in the second direction DR2. Each of the first connection portions CP1 may connect first sensing portions SP1 adjacent to each other, and each of the second connection portions CP2 may connect second sensing portions SP2 adjacent to each other.

The first sensing electrodes IE1-1 to IE1-5 and the second sensing electrodes IE2-1 to IE2-4 may have a mesh shape. In this case, a parasitic capacitance Cb formed between the display panel DP (refer to FIG. 2C) and the first sensing electrodes IE1-1 to IE1-5 and the second sensing electrodes IE2-1 to IE2-4 may be reduced.

Each of the first sensing electrodes IE1-1 to IE1-5 and the second sensing electrodes IE2-1 to IE2-4 may have a single-layer or multi-layer structure including multiple layers stacked in the third direction DR3. The single-layer structure may include a metal layer or a transparent conductive layer. The metal layer may include molybdenum, silver, titanium, copper, aluminum, or an alloy thereof. The transparent conductive layer may include a transparent conductive oxide, such as indium tin oxide (ITO), indium zinc oxide (IZO), zinc oxide (ZnO), indium zinc tin oxide (ITZO), or the like. In addition, the transparent conductive layer may include a conductive polymer such as PEDOT, a metal nanowire, a graphene, or the like.

The first sensing lines SL1-1 to SL1-5 may be respectively connected to one ends of the first sensing electrodes IE1-1 to IE1-5. According to an embodiment, the input sensing layer ISP may further include signal lines (not shown) that are connected to the other ends of the first sensing electrodes IE1-1 to IE1-5.

The first sensing lines SL1-1 to SL1-5, the second sensing lines SL2-1 to SL2-4, and the third sensing lines SL2-5 to SL2-8 may be disposed in the peripheral area NAA. The input pads I-PD of the pad part PLD may be disposed in the peripheral area NAA and extend from one ends of the first sensing lines SL1-1 to SL1-5, one ends of the second sensing lines SL2-1 to SL2-4, and one ends of the third sensing lines SL2-5 to SL2-8.

Figure 5A:
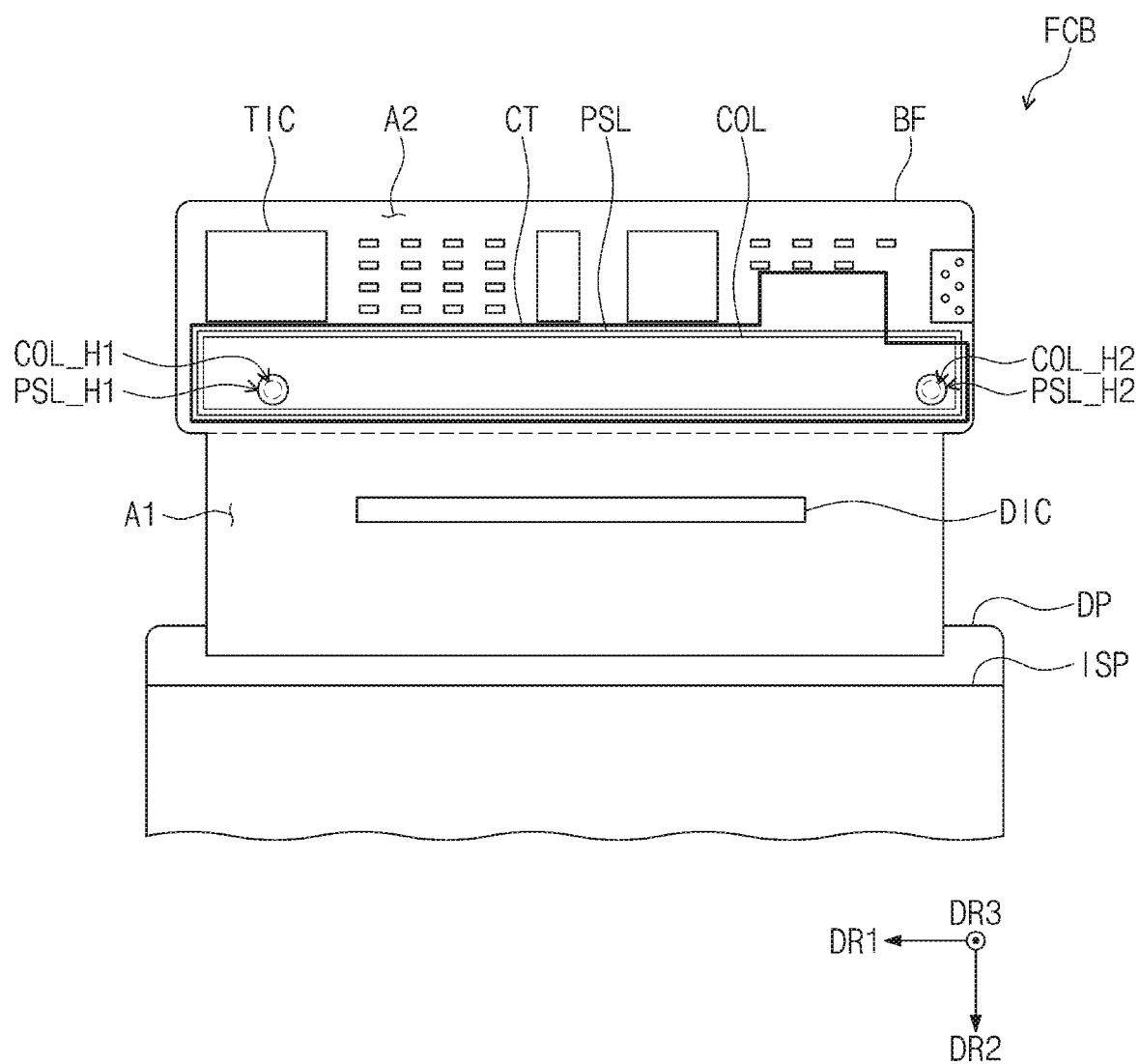
FIG. 5A and FIG. 5B are plan views showing a flexible circuit film according to some embodiments of the present disclosure.
Figure 5B:
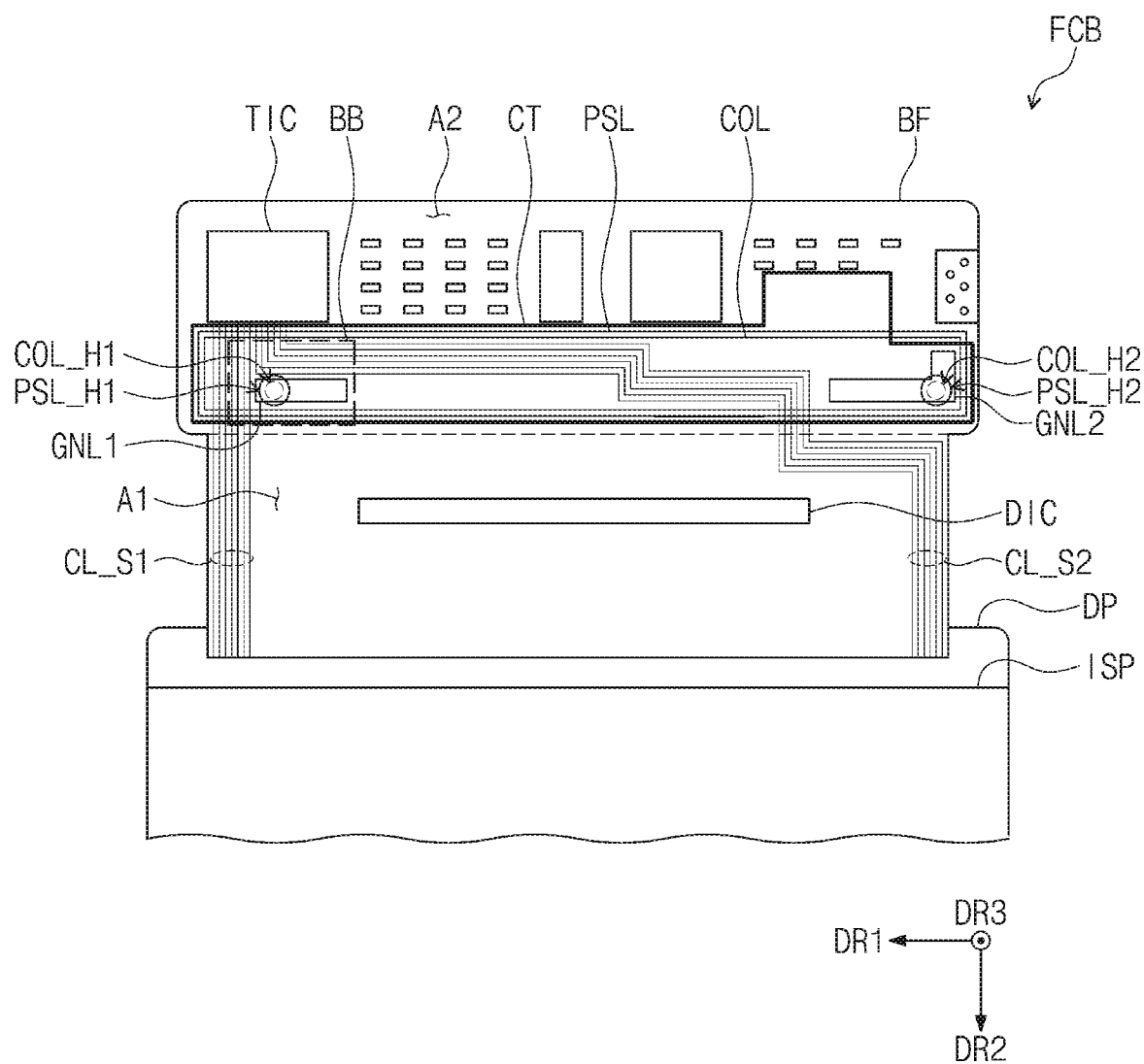

FIGS. 5A and 5B are plan views showing the flexible circuit film FCB according to some embodiments of the present disclosure.

Referring to FIGS. 2A, 3, 4, 5A, and 5B, one end of the flexible circuit film FCB may be connected to the display panel DP. For example, the flexible circuit film FCB may be electrically connected to the pad part PLD of the display panel DP. Accordingly, the flexible circuit film FCB may be electrically connected to the signal lines SGL of the display panel DP and the first, second, and third sensing lines SL1-1 to SL1-5, SL2-1 to SL2-4, and SL2-5 to SL2-8 of the input sensing layer ISP via the pad part PLD.

The panel driving chip DIC and the sensor driving chip TIC may be disposed on the flexible circuit film FCB. According to an embodiment, the flexible circuit film FCB may include a flexible material. As an example, the flexible circuit film FCB may be bent to allow the panel driving chip DIC and the sensor driving chip TIC to be disposed on the rear surface of the display panel DP.

The flexible circuit film FCB may include a base film BF. The base film BF may include an insulating material. As an example, the base film BF may include a polymer material, such as polyimide (PI), polyethylene terephthalate (PET), polyethylene naphthalate (PEN), or the like. According to an embodiment, the base film BF may have a thickness ranging from several tens of micrometers to several hundreds of micrometers, and the base film BF may be bent to the rear surface of the display panel DP from the front surface of the display panel DP.

According to an embodiment, the base film BF may include a first area A1 and a second area A2. The panel driving chip DIC may be mounted on the first area A1 of the base film BF, and the sensor driving chip TIC and various driving elements may be mounted on the second area A2 of the base film BF.

The flexible circuit film FCB may be disposed on the base film BF and may include a plurality of sensor connection lines that connect the sensor driving chip TIC to the pad part PLD of the display panel DP. The sensor connection lines may include a first group CL_S1 disposed at a first side of the panel driving chip DIC and a second group CL_S2 disposed at a second side of the panel driving chip DIC. Hereinafter, the first group CL_S1 and the second group CL_S2 of the sensor connection lines may be collectively referred to as sensor connection lines CL. In this case, the first side may correspond to a left side of the panel driving chip DIC, and the second side may correspond to a right side of the panel driving chip DIC.

The flexible circuit film FCB may include a plurality of ground lines. The ground lines may include copper and may receive a ground voltage. The ground lines may be disposed in the first area A1 of the base film BF. The ground lines may include a first ground line GNL1 and a second ground line GNL2. Hereinafter the first ground line GNL1 and the second ground line GNL2 may be collectively referred to as ground lines GNL. In the present example, two ground lines including the first ground line GNL1 and the second ground line GNL2 are provided, however, the number of the ground lines GNL should not be limited thereto or thereby.

The ground lines GNL may be disposed to be spaced apart from the sensor connection lines CL in the first area A1. The ground lines GNL may be electrically insulated from the sensor connection lines CL.

The flexible circuit film FCB may include a conductive layer COL disposed on the sensor connection lines CL. The conductive layer COL may include a conductive material, for example, a metal or a metal alloy. The conductive layer COL may overlap at least a portion of the sensor connection lines CL and the ground lines GNL. The conductive layer COL may include first holes COL_H1 and COL_H2, and at least a portion of the first ground line GNL1 and the second ground line GNL2 may be exposed through the first holes COL_H1 and COL_H2, respectively.

The flexible circuit film FCB may include an insulating layer PSL disposed on the conductive layer COL. The insulating layer PSL may include an insulating ink material, for example, a photo solder resist (PSR) ink. The insulating layer PSL may block noises from the outside. The insulating layer PSL may cover at least a portion of the sensor connection lines CL, and as an example, the insulating layer PSL may cover the sensor connection lines CL disposed in the second area A2 of the base film BF.

The insulating layer PSL may overlap the portion of the sensor connection lines CL and the ground lines GNL in the second area A2. The insulating layer PSL may include second holes PSL_H1 and PSL_H2, and at least a portion of the first ground line GNL1 and the second ground line GNL2 may be exposed through the second holes PSL_H1 and PSL_H2, respectively.

The flexible circuit film FCB may include a cover tape CT disposed on the insulating layer PSL and overlapping the ground lines GNL. In the present example, the cover tape CT having an integral shape is shown, however, the present disclosure should not be limited thereto or thereby. According to an embodiment, the cover tape CT may include a plurality of portions spaced apart from each other. The cover tape CT may include a conductive material.

The cover tape CT may block noises from the outside and may protect the sensor connection lines CL from being damaged by an external impact. The cover tape CT may contact the first ground line GNL1 and the second ground line GNL2 that are respectively exposed through the first holes COL_H1 and COL_H2 and the second holes PSL_H1 and PSL_H2.

The cover tape CT may overlap the conductive layer COL and the insulating layer PSL. In an embodiment, the cover tape CT may entirely overlap the conductive layer COL and may electrically interact with the conductive layer COL.

Figure 6:
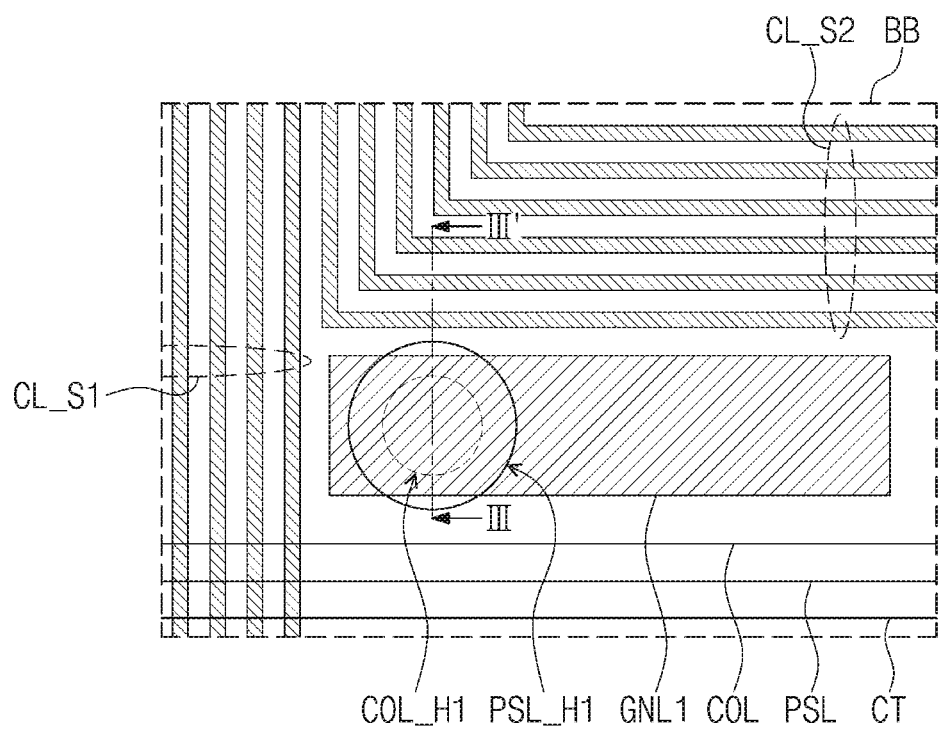
FIG. 6 is an enlarged plan view showing an area BB shown in FIG. 5B according to an embodiment of the present disclosure.

FIG. 6 is an enlarged plan view showing an area BB shown in FIG. 5B according to an embodiment of the present disclosure.

Referring to FIG. 6, the first hole COL_H1 may be defined through the conductive layer COL to overlap the first ground line GNL1. The second hole PSL_H1 may be defined through the insulating layer PSL to overlap the first ground line GNL1. The first hole COL_H1 may overlap the second hole PSL_H1. In an embodiment, the first hole COL_H1 may be smaller than the second hole PSL_H1, however, it should not be limited thereto or thereby.

The cover tape CT may overlap the first hole COL_H1 and the second hole PSL_H1.

Figure 7A:
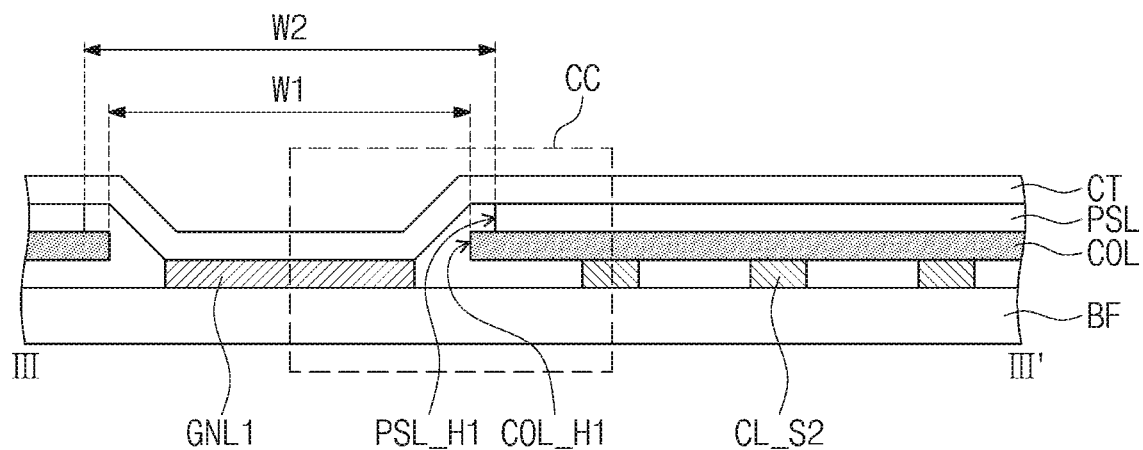
FIG. 7A is a cross-sectional view taken along a line III-III' shown in FIG. 6.

FIG. 7A is a cross-sectional view taken along a line III-III' shown in FIG. 6.

Referring to FIG. 7A, the first ground line GNL1 may be disposed on the base film BF, and the first ground line GNL1 may be exposed through the first hole COL_H1 and the second hole PSL_H1. As an example, the first hole COL_H1 defined through the conductive layer COL may have a first width W1. The second hole PSL_H1 defined through the insulating layer PSL may have a second width W2. As shown in FIG. 7A, the first width W1 is smaller than the second width W2, however, it should not be limited thereto or thereby. According to an embodiment, the first width W1 may be equal to or greater than the second width W2.

The cover tape CT may be in contact with the first ground line GNL1 that is exposed through the first and second holes COL_H1 and PSL_H1. The cover tape CT may be electrically connected to the first ground line GNL1 and may be grounded. The second ground line GNL2 (refer to FIG. 5B) may also be electrically connected to the cover tape CT.

An external impact may separate the cover tape CT from the first ground line GNL1 and/or the second ground line GNL2 rendering the cover tape CT to be electrically floating. According to the present disclosure, the flexible circuit film FCB may include the conductive layer COL disposed between the sensor connection lines CL_S1 and CL_S2 and the cover tape CT. Accordingly, even in a case where the cover tape CT may be electrically floating, a capacitance may be formed between the cover tape CT and the conductive layer COL to prevent the capacitance from being formed between the sensor connection lines CL_S1 and CL_S2 and the cover tape CT. Therefore, the capacitance formed between the cover tape CT and the conductive layer COL may prevent a ghost touch phenomenon in which a variation in capacitance between the cover tape CT and the sensor connection lines CL_S1 and CL_S2 is recognized as a touch even in the absence of a touch event. In addition, the capacitance formed between the cover tape CT and the conductive layer COL with the cover tape CT entirely overlapping the conductive layer COL may have a predetermined value that is measurable. The separation of the cover tape CT may be determined by measuring a deviation from the nominal capacitance between the cover tape CT and the conductive layer COL.

Figure 7B:
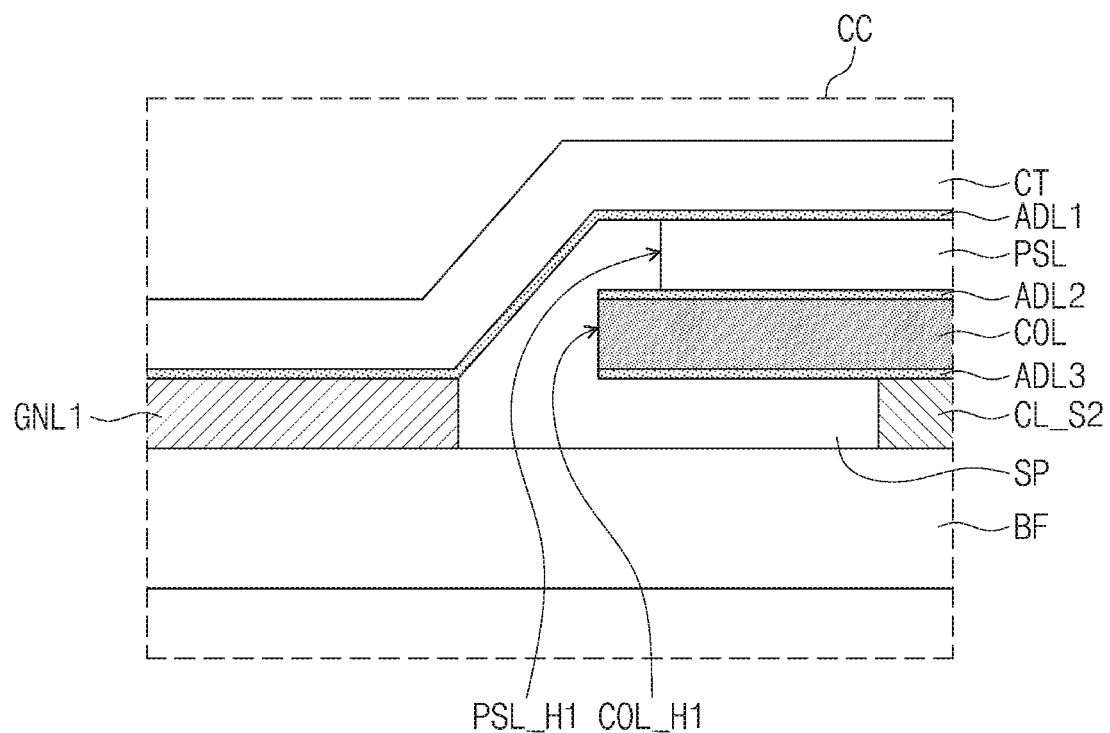
FIG. 7B is an enlarged plan view showing an area CC shown in FIG. 7A.

FIG. 7B is an enlarged plan view showing an area CC shown in FIG. 7A.

Referring to FIG. 7B, the flexible circuit film FCB may further include a first adhesive layer ADL1, a second adhesive layer ADL2, and a third adhesive layer ADL3. The first adhesive layer ADL1 may be disposed on a rear (or lower) surface of the cover tape CT. The second adhesive layer ADL2 may be disposed on a rear (or lower) surface of the insulating layer PSL. The third adhesive layer ADL3 may be disposed on a rear (or lower) surface of the conductive layer COL.

The first adhesive layer ADL1 may attach the cover tape CT to the insulating layer PSL. The first adhesive layer ADL1 may include a conductive adhesive material. As an example, the first adhesive layer ADL1 may be a film that includes metal particles, such as gold, silver, platinum, nickel, copper, carbon, etc., distributed in a synthetic resin. The synthetic resin may include a material, such as epoxy, silicon, polyimide, polyurethane, etc.

The first adhesive layer ADL1 may be directly in contact with the first ground line GNL1 and/or the second ground line GNL2 that may be respectively exposed through the first holes COL_H1 and COL_H2 and the second holes PSL_H1 and PSL_H2. Accordingly, the cover tape CT may be electrically connected to the first ground line GNL1 and/or the second ground line GNL2 through the first adhesive layer ADL1. The second adhesive layer ADL2 may attach the insulating layer PSL to the conductive layer COL. The third adhesive layer ADL3 may attach the conductive layer COL to the sensor connection line CL_S2. The third adhesive layer ADL3 may include an insulating material, for example, epoxy, silicon, silicon, polyimide, polyurethane, etc.

According to an embodiment, a space SP between the cover tape CT and the base film BF may be filled with air.

The display device DD may include the conductive layer COL between the cover tape CT and the sensor connection line CL_S2. The conductive layer COL may prevent the capacitance from being formed between the cover tape CT and the sensor connection line CL_S2, thereby improving a sensing performance of the input sensing layer ISP.

However, a position of the conductive layer COL should not be particularly limited in the flexible circuit film FCB. Hereinafter, flexible circuit films FCB will be described with reference to FIGS. 8A to 10B according to some embodiments of the present disclosure. In FIGS. 8A to 10B, the same reference numerals denote the same elements in FIGS. 1 to 7B, and detailed descriptions of the same elements will be omitted.

Figure 8A:
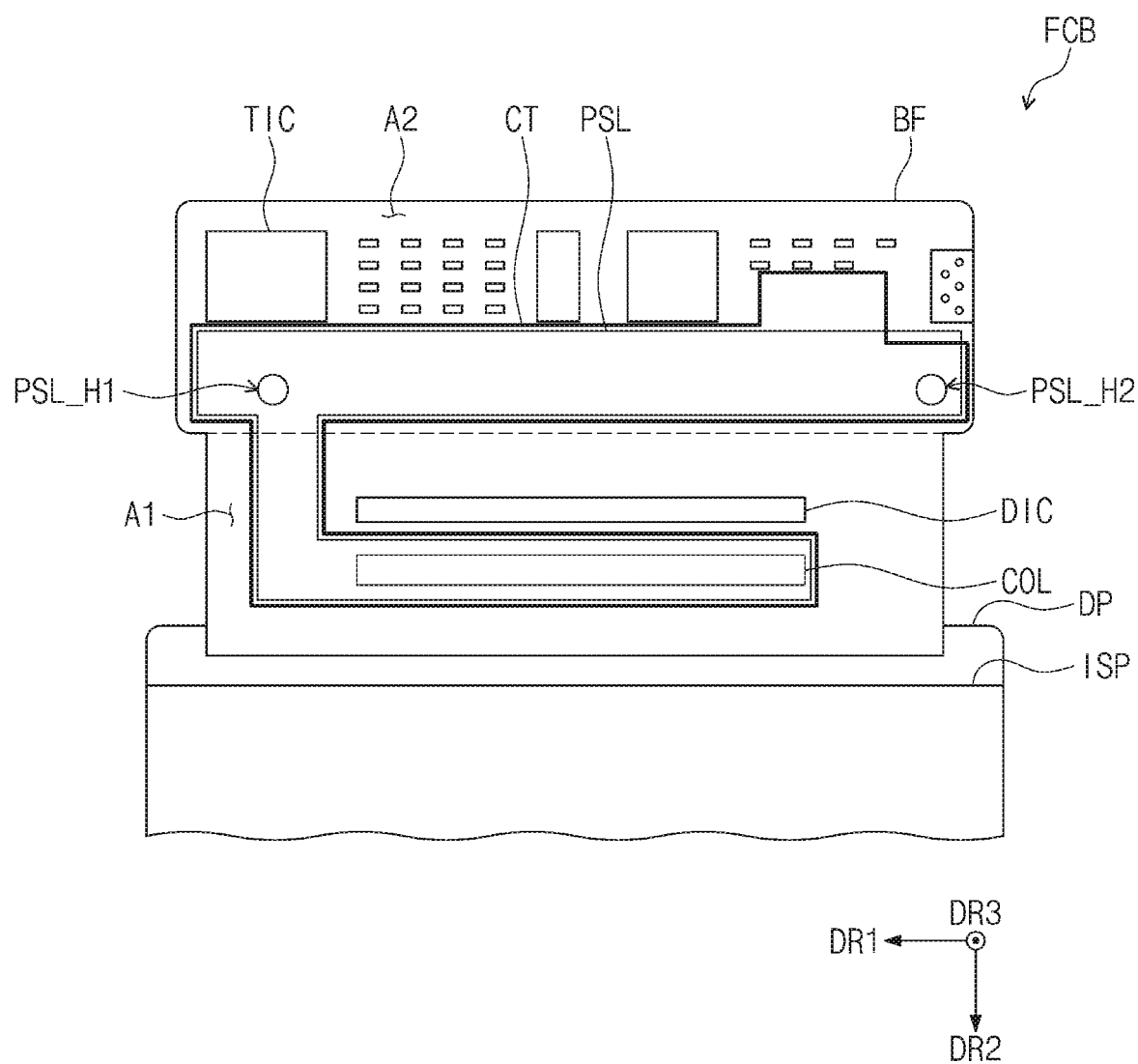
FIG. 8A and FIG. 8B are plan views showing a flexible circuit film according to an embodiment of the present disclosure.
Figure 8B:
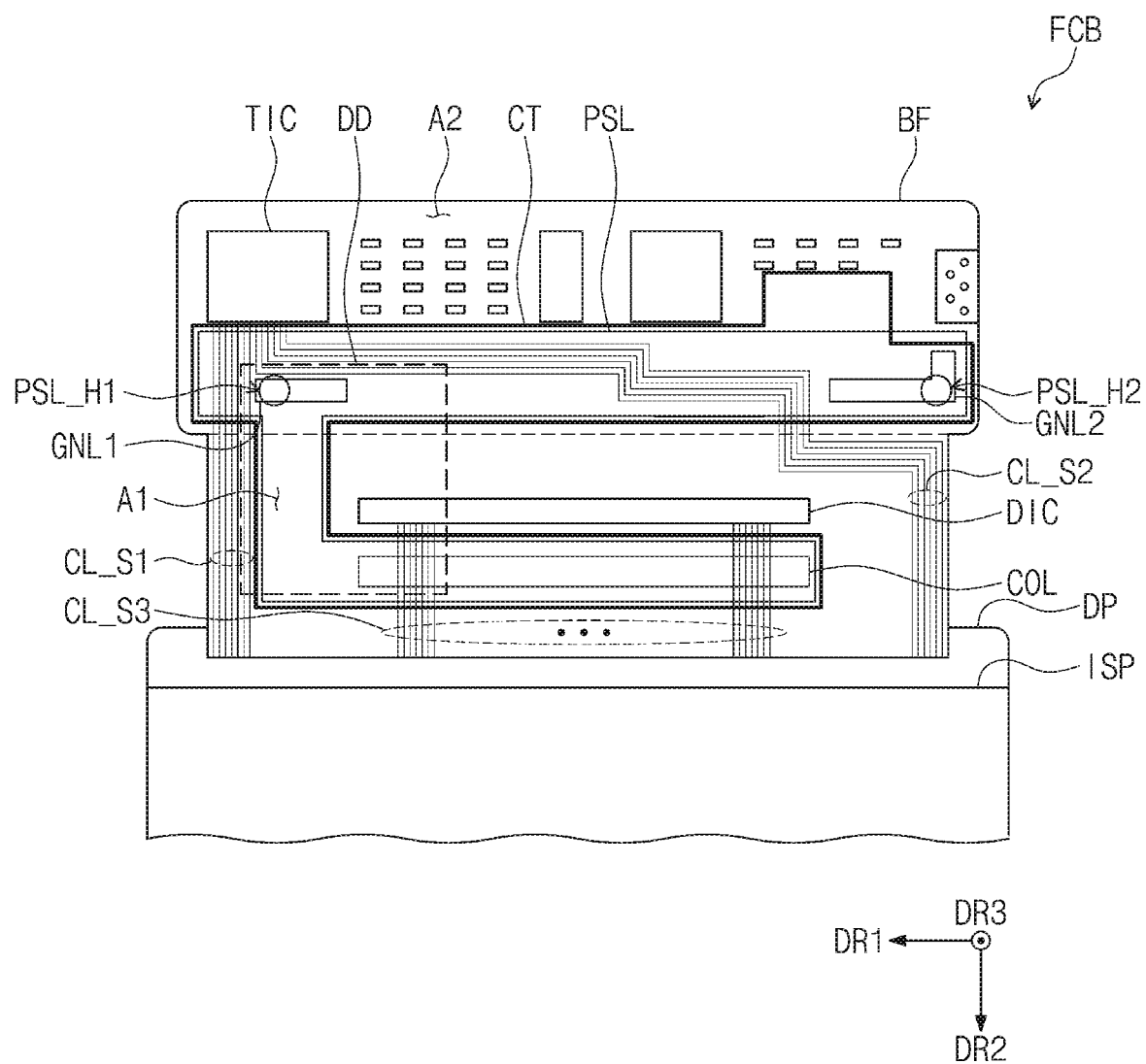

FIGS. 8A and 8B are plan views showing a flexible circuit film FCB according to an embodiment of the present disclosure.

Referring to FIGS. 2A, 3, 4, 8A, and 8B, the flexible circuit film FCB may include panel connection lines CL_S3 disposed in the first area A1 and connecting the panel driving chip DIC to the pad part PLD of the display panel DP. The panel connection lines CL_S3 may be disposed between the panel driving chip DIC and the pad part PLD. According to an embodiment, the conductive layer COL may be disposed in the first area A1 and may overlap at least a portion of the panel connection lines CL_S3.

According to an embodiment, the insulating layer PSL may overlap the portion of the panel connection lines CL_S3 in the first area A1 and may overlap at least a portion of the sensor connection lines CL_S1 and CL_S2 and the ground lines GNL1 and GNL2 in the second area A2. The insulating layer PSL may include second holes PSL_H1 and PSL_H2, and at least a portion of the first ground line GNL1 and the second ground line GNL2 may be respectively exposed through the second holes PSL_H1 and PSL_H2.

The cover tape CT may be disposed in the first and second areas A1 and A2. The cover tape CT may overlap at least a portion of the panel connection lines CL_S3 in the first area A1 and may overlap the ground lines GNL1 and GNL2 in the second area A2.

Figure 9:
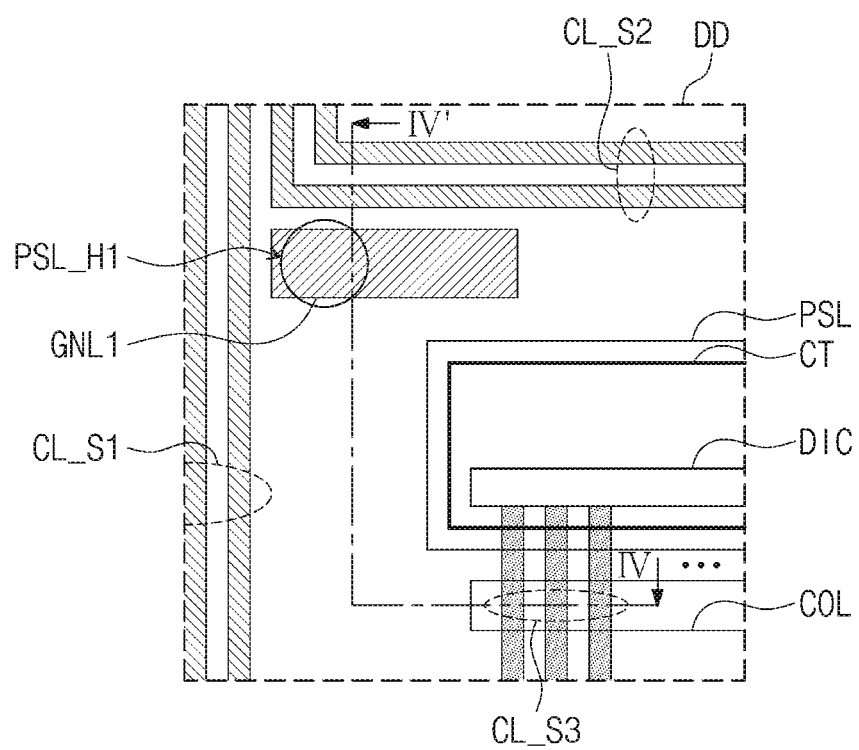
FIG. 9 is an enlarged plan view showing an area DD shown in FIG. 8B.

FIG. 9 is an enlarged plan view showing an area DD shown in FIG. 8B.

Referring to FIG. 9, the conductive layer COL may not overlap the sensor connection lines CL_S1 and CL_S2 but may overlap the portion of the panel connection lines CL_S3. Since the conductive layer COL do not overlap the first and second ground lines GNL1 and GNL2, holes such as the first holes COL_H1 and COL_H2 may not be defined in the conductive layer COL.

Figure 10A:
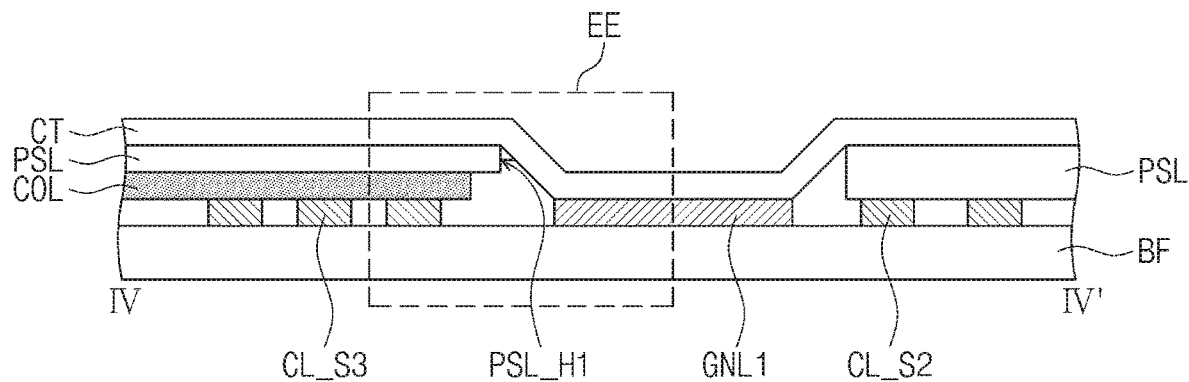
FIG. 10A is a cross-sectional view taken along a line IV-IV' shown in FIG. 9.

FIG. 10A is a cross-sectional view taken along a line IV-IV' shown in FIG. 9.

Referring to FIG. 10A, the first ground line GNL1 may be disposed on the base film BF, and the first ground line GNL1 may be exposed through the second hole PSL_H1. The cover tape CT may be in contact with the first ground line GNL1 that is exposed through the second hole PSL_H1. The cover tape CT may be electrically connected to the first ground line GNL1 and may be grounded. The second ground line GNL2 (refer to FIG. 8B) may be electrically connected to the cover tape CT.

An external impact may separate the cover tape CT from the first ground line GNL1 and/or the second ground line GNL2 rendering the cover tape CT to be electrically floating. According to the present disclosure, the flexible circuit film FCB may include the conductive layer COL disposed between the panel connection lines CL_S3 and the cover tape CT. Accordingly, even in a case where the cover tape CT may be electrically floating to prevent a capacitance from being formed between the cover tape CT and the conductive layer COL. In addition, the capacitance formed between the cover tape CT and the conductive layer COL with the cover tape CT entirely overlapping the conductive layer COL may have a predetermined value that is measurable. The separation of the cover tape CT may be determined by measuring a deviation from the nominal capacitance between the cover tape CT and the conductive layer COL.

Figure 10B:
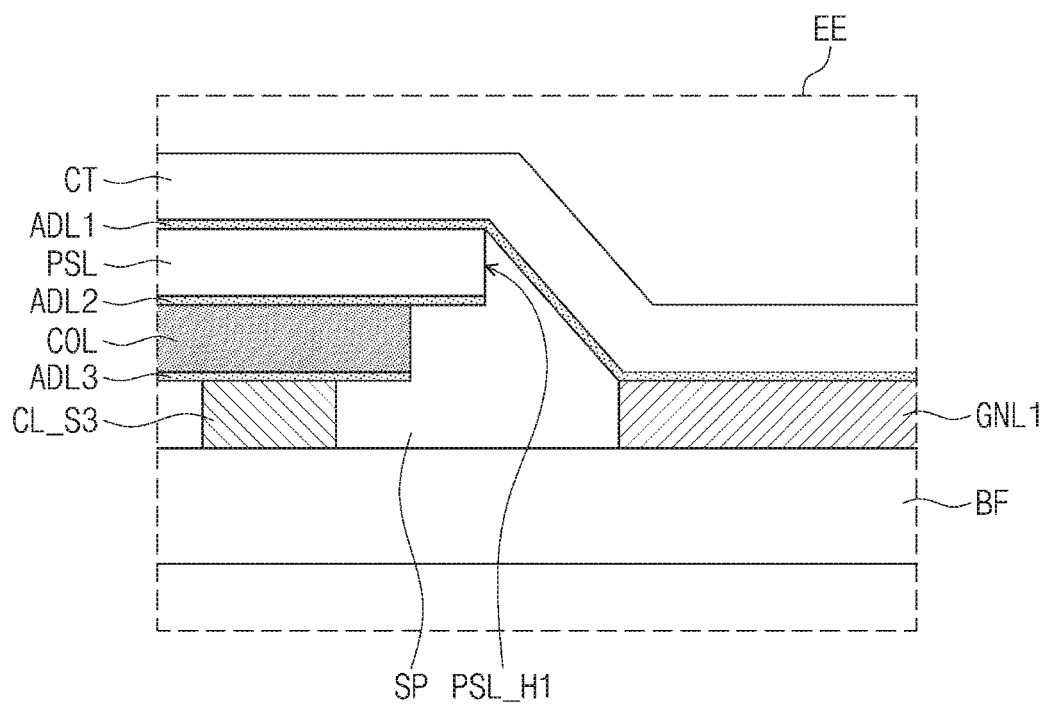
FIG. 10B is an enlarged plan view showing an area EE shown in FIG. 10A.

FIG. 10B is an enlarged plan view showing an area EE shown in FIG. 10A.

Referring to FIG. 10B, the flexible circuit film FCB may further include the first, second, and third adhesive layers ADL1, ADL2, and ADL3. The first adhesive layer ADL1 may be disposed on the rear (or lower) surface of the cover tape CT. The second adhesive layer ADL2 may be disposed on the rear (or lower) surface of the insulating layer PSL. The third adhesive layer ADL3 may be disposed on the rear (or lower) surface of the conductive layer COL.

The first adhesive layer ADL1 may attach the cover tape CT to the insulating layer PSL. The first adhesive layer ADL1 may include a conductive adhesive material. As an example, the first adhesive layer ADL1 may be a film that includes metal particles, such as gold, silver, platinum, nickel, copper, carbon, etc., distributed in a synthetic resin. The synthetic resin may include a material, such as epoxy, silicon, polyimide, polyurethane, etc.

The first adhesive layer ADL1 may be directly in contact with the first ground line GNL1 and/or the second ground line GNL2 that may be respectively exposed through the second holes PSL_H1 and PSL_H2. Accordingly, the cover tape CT may be electrically connected to the first ground line GNL1 and/or the second ground line GNL2 through the first adhesive layer ADL1. The second adhesive layer ADL2 may attach the insulating layer PSL to the conductive layer COL. The third adhesive layer ADL3 may attach the conductive layer COL to the panel connection lines CL_S3. The third adhesive layer ADL3 may include an insulating material, for example, epoxy, silicon, polyimide, polyurethane, etc.

According to an embodiment, the space SP between the cover tape CT and the base film BF may be filled with air.

The display device DD may include the conductive layer COL between the cover tape CT and the panel connection lines CL_S3. Separation of the cover tape CT from the first ground line GNL1 and/or the second ground line GNL2 may be determined by measuring the capacitance formed between the cover tape CT and the conductive layer COL.

Figure 11:
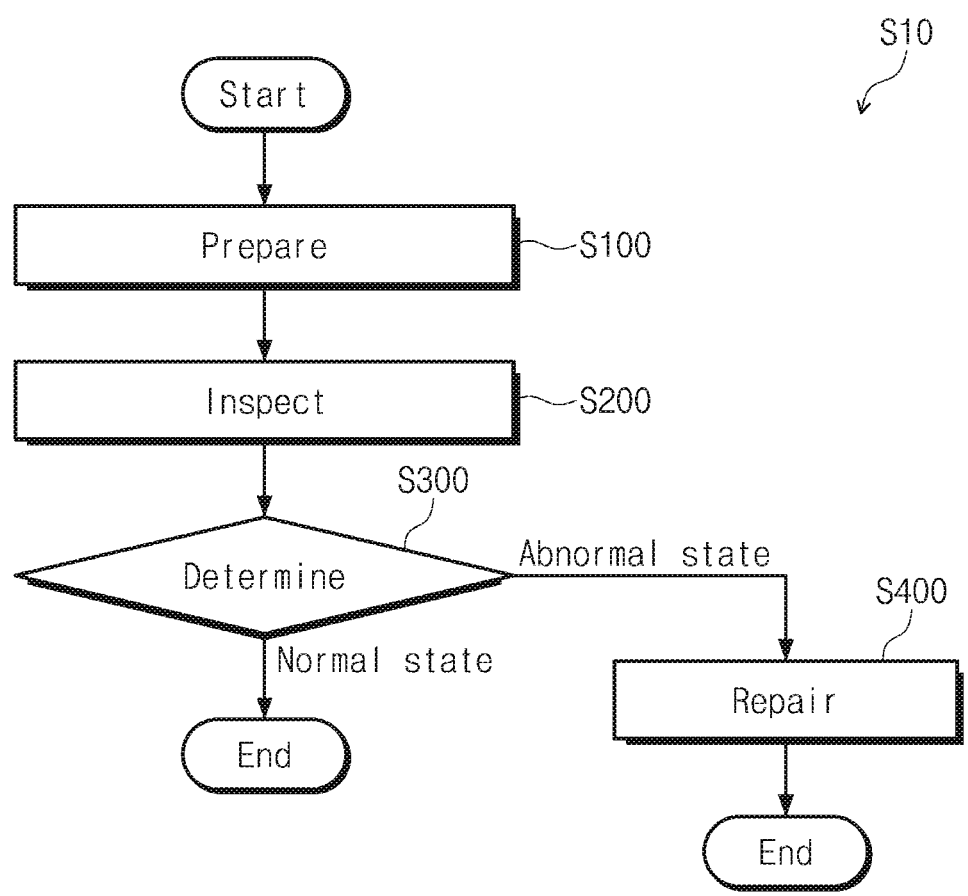
FIG. 11 is a flowchart showing a method of detecting a defect of a display device according to an embodiment of the present disclosure.

FIG. 11 is a flowchart showing a method of detecting a defect of the display device (S10) according to an embodiment of the present disclosure.

Referring to FIG. 11, the defect detecting method of the display device (S10) may include preparing (S100) and inspecting (S200) the display device, however, it should not be limited thereto or thereby. The defect detecting method of the display device (S10) may further include determining (S300) and repairing (S400) the display device.

The preparing (S100) may include providing the display module including the display panel and the input sensing layer, and the flexible circuit film connected to the display module. Details on the display panel DP, the input sensing layer ISP, and the display module DM described with reference to FIGS. 1 to 4 may be applied to the display panel, the input sensing layer, and the display module described with reference to FIG. 11.

Similarly, details on the flexible circuit film FCB described with reference to FIGS. 5A to 10B may be applied to the flexible circuit film described with reference to FIG. 11.

That is, the flexible circuit film FCB may include the base film BF, the first and second ground lines GNL1 and GNL2 disposed on the base film BF, the connection lines CL_S1, CL_S2, and CL_S3 disposed on the base film BF and electrically connected to at least one of the input sensing layer ISP and the display panel DP, the conductive layer COL overlapping at least a portion of the connection lines CL_S1, CL_S2, and CL_S3 and disposed on the connection lines CL_S1, CL_S2, and CL_S3, the insulating layer PSL disposed on the conductive layer COL, and the cover tape CT disposed on the insulating layer PSL. Among the connection lines CL_S1, CL_S2, and CL_S3, the sensor connection lines CL_S1 and CL_S2 may connect the sensor driving chip TIC to the input sensing layer ISP, and the panel connection lines CL_S3 may connect the panel driving chip DIC to the display panel DP.

The inspecting (S200) may include measuring a capacitance between the conductive layer COL and the cover tape CT. In an embodiment, the inspecting (S200) may include measuring the capacitance between the conductive layer COL and the cover tape CT that are disposed on the sensor connection line CL_S2 as shown in FIGS. 7A and 7B. According to another embodiment, the inspecting (S200) may include measuring the capacitance between the conductive layer COL and the cover tape CT that are disposed on the panel connection lines CL_S3 as shown in FIGS. 10A and 10B.

The determining (S300) may include receiving the capacitance measured in the inspecting (S200) to determine whether a state of connection between the cover tape CT and the ground lines GNL1 and GNL2 is in a normal state or an abnormal state. In the normal state, a capacitance lower than a threshold value may be measured during the inspecting (S200). In an embodiment, the threshold value may be zero. That is, the normal state refers to a state in which the cover tape CT is electrically connected to the first ground line GNL1 and/or the second ground line GNL2 and is grounded. The determining (S300) may be performed by a controller provided inside or outside the display device DD of FIG. 1 or a manufacturer of the display device DD.

In the abnormal state, a capacitance equal to or greater than the threshold value may be measured in the inspecting (S200). That is, the abnormal state refers to a state in which the cover tape CT is floated from the first ground line GNL1 and/or the second ground line GNL2 and forms a capacitance with the conductive layer COL.

In a case where it is determined that the capacitance state is in the abnormal state in the determining (S300), the defect detecting method of the display device (S10) may further include the repairing (S400). The repairing (S400) may include reconnecting the cover tape CT that may be electrically floating to the first ground line GNL1 and/or the second ground GNL2.

The defect detecting method of the display device (S10) may include measuring a capacitance between the cover tape and the conductive layer in the flexible circuit film that includes the conductive layer disposed between the connection line connected to the display module and the cover tape, and detecting whether the cover tape is separated from the ground line. In a case where it is detected that the cover tape is separated from the ground line, a defect of the display device may be repaired by reconnecting the cover tape that may be separated from the ground line by reconnecting to the ground line, thereby reducing a defective rate of the display device.

The flexible circuit film included in the display device DD may include the conductive layer disposed between the connection line connected to the display module and the cover tape. Accordingly, although the cover tape may be separated from the ground line, formation of capacitance between the connection line and the cover tape may be prevented. In particular, formation and/or a change of the capacitance between the connection line that is connected to the input sensing layer and the cover tape may be prevented. Thus, the display device DD may prevent the sensor driving chip from sensing a ghost touch event, thereby improving the sensitivity of the input sensing layer.

Although some embodiments of the present disclosure have been described, it is understood that the present disclosure should not be limited to these embodiments, and various changes and modifications can be made by one ordinary skilled in the art within the spirit and scope of the present disclosure. Therefore, the disclosed subject matter should not be limited to any particular embodiment described herein, and the scope of the inventive concept of the present disclosure shall be determined according to the entirety of the present disclosure including the attached claims.

What is claimed is:
1. A display device comprising:
a display module comprising a display panel and an input sensing layer disposed on the display panel; and
a flexible circuit film connected to the display module,
wherein the flexible circuit film comprises:
a base film;
a ground line disposed on the base film;
a plurality of connection lines disposed on the base film and electrically connected to at least one of the input sensing layer and the display panel;

a conductive layer disposed on the plurality of connection lines and overlapping at least a portion of the plurality of connection lines in a plan view;

an insulating layer disposed on the conductive layer; and a cover tape disposed on the insulating layer and overlapping the ground line in the plan view, wherein the conductive layer overlaps at least a portion of the cover tape in the plan view.

2. The display device of claim 1, wherein the flexible circuit film further comprises a sensor driving chip that is electrically connected to the input sensing layer and disposed on the base film.

3. The display device of claim 2, wherein the plurality of connection lines comprise a plurality of sensor connection lines connecting the input sensing layer to the sensor driving chip, and the conductive layer overlaps at least a portion of the plurality of sensor connection lines in the plan view.

4. The display device of claim 3, wherein the input sensing layer comprises:
a first sensing electrode;
a second sensing electrode insulated from the first sensing electrode and forming a capacitance with the first sensing electrode;
a first sensing line connected to the first sensing electrode; and
a second sensing line connected to the second sensing electrode.

5. The display device of claim 4, wherein each of the first sensing line and the second sensing line is electrically connected to the plurality of sensor connection lines.

6. The display device of claim 1, wherein the conductive layer includes a first hole that exposes the ground line, and the insulating layer includes a second hole that exposes the ground line.

7. The display device of claim 6, wherein the cover tape contacts a portion of the ground line that is exposed through the first hole and the second hole.

8. The display device of claim 1, wherein the flexible circuit film further comprises a panel driving chip that is electrically connected to the display panel and disposed on the base film.

9. The display device of claim 8, wherein the plurality of connection lines comprise a plurality of driving lines connecting the display panel to the panel driving chip, and the conductive layer overlaps at least a portion of the plurality of driving lines in the plan view.

10. The display device of claim 8, wherein the insulating layer includes a hole that exposes the ground line, and the cover tape contacts a portion of the ground line that is exposed through the hole.

11. The display device of claim 1, wherein the display panel comprises:
a light emitting element layer comprising a light emitting element; and
an encapsulation layer covering the light emitting element layer.

12. The display device of claim 11, wherein the input sensing layer is disposed directly on the encapsulation layer.

13. The display device of claim 1, wherein the flexible circuit film further comprises at least one adhesive layer that is disposed between any two of the plurality of connection lines, the conductive layer, the insulating layer, and the cover tape that are adjacent to each other.

14. The display device of claim 1, wherein the cover tape is a conductive tape.

15. A method comprising:
preparing a display module of a display device that comprises a display panel and an input sensing layer;
preparing a flexible circuit film that is connected to the display module, the flexible circuit film comprising a base film, a ground line disposed on the base film, a plurality of connection lines disposed on the base film and electrically connected to at least one of the input sensing layer and the display panel, a conductive layer disposed on the plurality of connection lines and overlapping at least a portion of the plurality of connection lines in a plan view, an insulating layer disposed on the conductive layer, and a cover tape disposed on the insulating layer;
inspecting a capacitance formed between the conductive layer and the cover tape; and
detecting a defect of the display device based on the capacitance.

16. The method of claim 15, wherein an entire surface of the conductive layer overlaps the cover tape in the plan view.

17. The method of claim 15, wherein the flexible circuit film further comprises a sensor driving chip and a panel driving chip that are disposed on the base film, and the plurality of connection lines connect the sensor driving chip to the input sensing layer or connect the panel driving chip to the display panel.

18. The method of claim 15, wherein a state of connection between the ground line and the cover tape is determined as a normal state based on the capacitance lower than a threshold value, and the state of connection between the ground line and the cover tape is determined as an abnormal state based on the capacitance equal to or greater than the threshold value.

19. The method of claim 18, further comprising repairing the defect of the cover tape being separated from the ground line by reconnecting the cover tape to the ground line in response to the abnormal state.

20. An electronic device comprising:
a display device comprising:
a display module comprising a display panel and an input sensing layer disposed on the display panel; and
a flexible circuit film connected to the display module, wherein the flexible circuit film comprises:
a base film;
a ground line disposed on the base film;
a plurality of connection lines disposed on the base film and electrically connected to at least one of the input sensing layer and the display panel;
a conductive layer disposed on the plurality of connection lines and overlapping at least a portion of the plurality of connection lines in a plan view;
an insulating layer disposed on the conductive layer; and
a cover tape disposed on the insulating layer and overlapping the ground line in the plan view,
wherein the conductive layer overlaps at least a portion of the cover tape in the plan view.

* * * * *